(12) United States Patent
Hensel et al.

(10) Patent No.: US 9,613,175 B2
(45) Date of Patent: Apr. 4, 2017

(54) METHOD, COMPUTER SYSTEM AND COMPUTER-READABLE STORAGE MEDIUM FOR CREATING A LAYOUT OF AN INTEGRATED CIRCUIT

(71) Applicant: GLOBALFOUNDRIES Inc., Grand Kayman (KY)

(72) Inventors: Ulrich Hensel, Radeberg (DE); Rainer Mann, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 209 days.

(21) Appl. No.: 14/166,044

(22) Filed: Jan. 28, 2014

(65) Prior Publication Data

US 2015/0213185 A1    Jul. 30, 2015

(51) Int. Cl.
*G06F 17/00*  (2006.01)
*G06F 17/50*  (2006.01)

(52) U.S. Cl.
CPC .............................. *G06F 17/5081* (2013.01)

(58) Field of Classification Search
USPC ........................................................ 716/112
See application file for complete search history.

(56) References Cited

U.S. PATENT DOCUMENTS

| | | | |
|---|---|---|---|
| 8,418,105 B1 | 4/2013 | Wang et al. | |
| 8,429,582 B1 | 4/2013 | Lai et al. | |
| 2004/0104442 A1 | 6/2004 | Feudel et al. | |
| 2007/0079269 A1* | 4/2007 | Corbeil, Jr. | G06F 17/5081 716/112 |
| 2010/0064269 A1* | 3/2010 | Lai | G06F 17/5081 716/107 |
| 2010/0083208 A1* | 4/2010 | Lai | G06F 17/5081 716/118 |
| 2010/0191357 A1 | 7/2010 | Maeda et al. | |
| 2011/0309333 A1 | 12/2011 | Cheng et al. | |

(Continued)

FOREIGN PATENT DOCUMENTS

TW    200418113 A    9/2004
TW    201224817 A    6/2012
(Continued)

OTHER PUBLICATIONS

Translation of Official Action from Taiwan Patent Application No. 103142319, dated Nov. 12, 2015.
(Continued)

*Primary Examiner* — Mohammed Alam
(74) *Attorney, Agent, or Firm* — Amerson Law Firm, PLLC

(57) ABSTRACT

A method includes obtaining a plurality of design rules for an integrated circuit, including a first set of design rules and a second set of design rules. An automated layout construction process performed on the basis of the first set of design rules but not on the basis of the second set of design rules creates a layout of the integrated circuit. The layout of the integrated circuit is checked for design rule violations wherein at least one member of the second set of design rules is not satisfied. The layout of the integrated circuit is modified for bringing the layout into conformity with each of the plurality of design rules if one or more design rule violations are found in the checking of the integrated circuit.

19 Claims, 13 Drawing Sheets

(56) References Cited

U.S. PATENT DOCUMENTS

| | | | | |
|---|---|---|---|---|
| 2012/0124536 A1* | 5/2012 | Sharma | ............... | G06F 17/5081 |
| | | | | 716/112 |
| 2013/0086541 A1* | 4/2013 | Luo | .................... | G06F 17/5081 |
| | | | | 716/112 |
| 2013/0086542 A1* | 4/2013 | Teoh | ................... | G06F 17/5031 |
| | | | | 716/113 |
| 2015/0089459 A1 | 3/2015 | Liu | ................................ | 716/53 |
| 2015/0213185 A1* | 7/2015 | Hensel | ................ | G06F 17/5081 |
| | | | | 716/112 |

FOREIGN PATENT DOCUMENTS

| | | |
|---|---|---|
| TW | 201339877 A | 10/2013 |
| TW | 201403215 A | 1/2014 |

OTHER PUBLICATIONS

Examination Report for Taiwan Patent Application No. 103121137 dated Oct. 19, 2015.
Translation of Official Action from Taiwan Patent Application No. 103142319, dated Feb. 26, 2016.
Maier and Minas, "Pattern-Based Layout Specifications for Visual Language Editors," Proceedings of the Workship Visual Formations for Patterns at VL/HCC 2009, Electronic Communications of the EASST, vol. 25, 13 pages, 2010.

\* cited by examiner

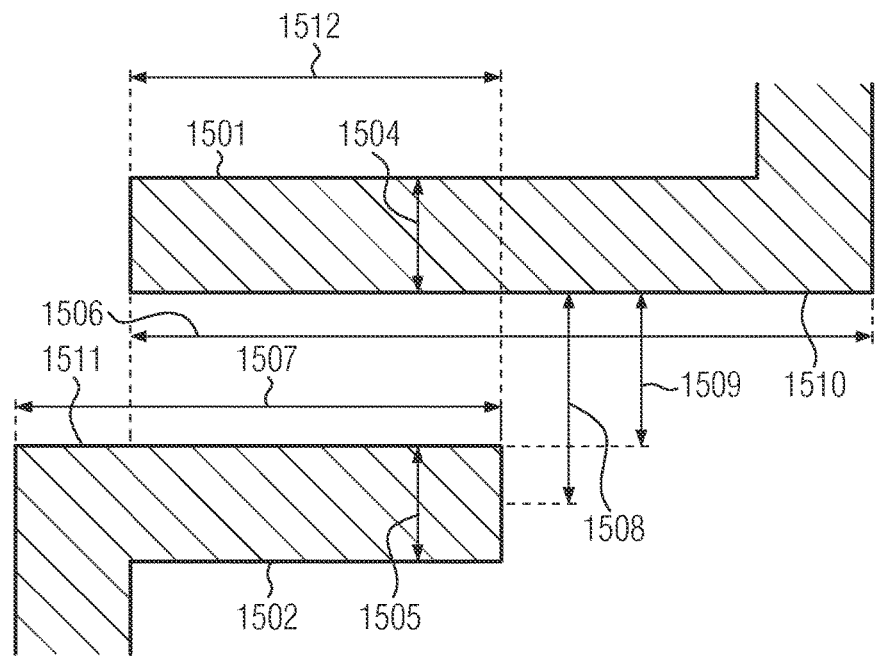
FIG. 15
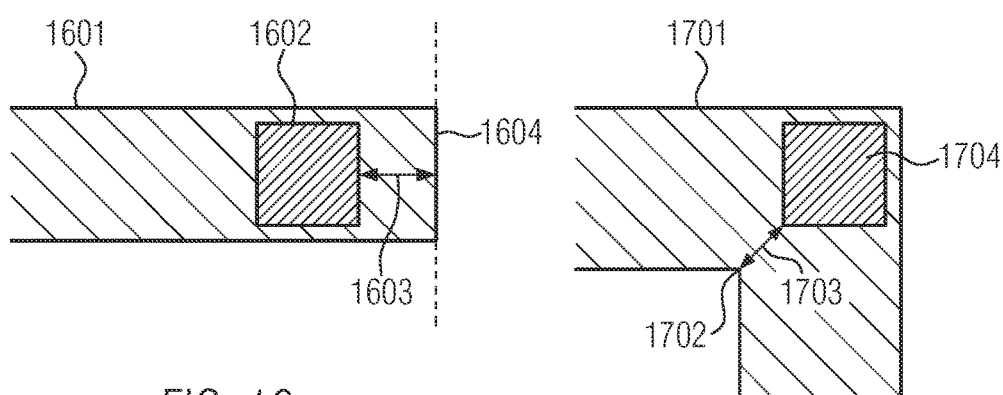
FIG. 16
FIG. 17

METHOD, COMPUTER SYSTEM AND COMPUTER-READABLE STORAGE MEDIUM FOR CREATING A LAYOUT OF AN INTEGRATED CIRCUIT

BACKGROUND OF THE INVENTION

1. Field of the Invention

The present disclosure relates to the manufacturing of integrated circuits, in particular to the creation of a layout of an integrated circuit using electronic design automation techniques.

2. Description of the Related Art

Integrated circuits typically include a large number of circuit elements which include, in particular, field effect transistors. Other types of circuit elements which may be present in integrated circuits include capacitors, diodes and resistors. The circuit elements in an integrated circuit may be electrically connected by means of electrically conductive metal lines formed in a dielectric material, for example by means of damascene techniques. The electrically conductive metal lines may be provided in a plurality of interconnect layers that are stacked on top of each other above a substrate in and on which circuit elements, such as field effect transistors, capacitors, diodes and resistors, are formed. Metal lines in different interconnect layers may be electrically connected with each other by means of contact vias that are filled with metal.

Due to the complexity of modern integrated circuits, in the design of integrated circuits, automated design techniques are typically employed.

The design of an integrated circuit may employ a number of steps. The steps may include the creation of a user specification that defines the functionality of the integrated circuit. The user specification may be the basis for the creation of a register transfer level description that models the integrated circuit in terms of a flow of signals between hardware registers and logical operations performed on those signals. The register transfer level description of the integrated circuit may then be used for the physical design of the integrated circuit, wherein a layout of the integrated circuit is created. The thus created layout may be the basis for the formation of photomasks that may be employed for patterning materials in the manufacturing of the integrated circuit.

The creation of a layout of an integrated circuit may be based on design rules that define constraints for the layout of the integrated circuit. Design rules may, for example, define spacings between circuit features of the integrated circuit, for example spacings between metal lines and/or contact vias, widths of circuit features, for example widths of metal lines, enclosures defining margins for circuit features that cover other circuit features, for example metal lines covering contact vias, or constraints relating to the relative arrangement of circuit features.

In the creation of a layout of an integrated circuit, the design rules may be modeled and provided to an layout construction tool that performs an automated layout construction process wherein the layout of the integrated circuit is created.

After the creation of the layout, the layout may be verified and/or optimized. In particular, design rule checks may be performed for confirming if the created layout fulfills all the design rules. If errors are found in the layout, the layout may be fixed. For this purpose, pattern matching techniques may be employed.

U.S. Pat. No. 8,429,582 discloses a method for automatic fixing of a layout. A first pattern from an electronic layout is identified. This may be done in accordance with a design rule checking error marker. One or more second patterns, which may provide a fixing of the error, may be identified from a database or other type of data structure of known "good" patterns, for example, in terms of design rule checking. The patterns may be grouped, and scoring processes may be performed to select one of a plurality of second patterns.

U.S. Pat. No. 8,418,105 discloses performing design rule checks and rule-based checks for double patterning technology compliance. If a design fails, an automated decomposition process decomposes the design, and a post-decomposed layout is generated, which is again checked for design rule and double patterning technology compliance. The layout may be scanned at error locations for similarities with pre-characterized patterns in a library of pre-characterized double patterning technology compliant patterns. When a match is found, an automated fixing of the problematic locations in the layout may be performed on the basis of the matching pattern.

In advanced techniques for the formation of integrated circuits, for example, techniques in accordance with the 20 nm technology node, a relatively large number of design rules may be involved. Furthermore, there may be design rules having a greater degree of complexity as compared to design rules that had to be considered in earlier technology nodes.

Existing algorithms for the layout of integrated circuits are typically optimized for a large variety of layout choices that are correct for a relatively small set of design rules. In contrast thereto, the design rules involved in advanced techniques for the formation of integrated circuits may constrain the space of correct layouts to a large degree, such that only a limited set of design constructs or patterns may remain for a desired layout situation. Furthermore, there may be design rules wherein modeling the design rules for the layout construction tool is difficult. Therefore, in some situations, a pessimistic modeling of design rules for automatic layout construction tools is employed, wherein design rules that cannot be modeled soundly for the layout construction tool are replaced with rules that can be modeled more easily, but lead to greater restrictions of the space of correct layouts than the original design rules.

Issues that may occur when conventional techniques for the creation of layouts are applied for integrated circuits that are to be formed using advanced process techniques may, thus, include pessimistic layouts, wherein an area required by the integrated circuit on a wafer and/or a speed of operation of the integrated circuit are less than optimal. Furthermore, conventional approaches may lead to a relatively large turn-around time, because a convergence of existing algorithms for the creation of layouts of integrated circuits may be difficult. Moreover, in some situations, a relatively large amount of manual fixing of the layout of an integrated circuit may be required.

In view of the situation described above, the present disclosure provides methods, computer systems and computer-readable storage media that may help to avoid or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes obtaining a plurality of design rules for an integrated circuit. A part of the plurality of design rules is selected. An unselected rest of the plurality of design rules is included into a first set of design rules. The selected part of the plurality of design rules is included into a second set of design rules. An automated layout construction process is performed. The automated layout construction process creates a layout of the integrated circuit. The automated layout construction process is performed on the basis of the first set of design rules but not on the basis of the second set of design rules. The layout of the integrated circuit is checked for design rule violations wherein at least one member of the second set of design rules is not satisfied. The layout of the integrated circuit is modified for bringing the layout of the integrated circuit into conformity with each of the plurality of design rules if one or more design rule violations are found in the checking of the integrated circuit.

An illustrative computer system disclosed herein includes a detection pattern library, a repair pattern library, a layout construction tool, a pattern matching tool, a classifier and a repair pattern selector. The detection pattern library includes a set of detection patterns. The repair pattern library includes a set of repair patterns. The layout construction tool performs an automated layout construction process. The automated layout construction process creates a layout of an integrated circuit and is performed on the basis of a first set of design rules but not on the basis of a second set of design rules. The pattern matching tool performs a pattern matching process for identifying one or more sections of the layout of the integrated circuit that match at least one member of the set of detection patterns. Each match is indicative of a design rule violation wherein at least one member of the second set of design rules is not satisfied. The classifier classifies the one or more sections of the layout of the integrated circuit. The repair pattern selector selects one or more repair patterns from the repair pattern library for each of the one or more sections of the layout of the integrated circuit on the basis of the classification of the respective section of the layout of the integrated circuit. The layout construction tool receives the selected one or more repair patterns and modifies the layout of the integrated circuit for bringing the layout of the integrated circuit into conformity with the second set of design rules on the basis of the selected one or more repair patterns.

Another illustrative computer system disclosed herein includes a detection pattern library including a set of detection patterns and a repair pattern library including a set of repair patterns. Additionally, the computer system includes means for performing an automated layout construction process. The automated layout construction process creates a layout of an integrated circuit and is performed on the basis of a first set of design rules but not on the basis of a second set of design rules. The computer system further includes means for performing a pattern matching process for identifying one or more sections of the layout of the integrated circuit that match at least one member of the set of detection patterns. Each match is indicative of a design rule violation wherein at least one member of the second set of design rules is not satisfied. The computer system further includes means for classifying the one or more sections of the layout of the integrated circuit and means for selecting one or more repair patterns for each of the one or more sections of the layout of the integrated circuit from the repair pattern library. The selection of the one or more repair patterns is performed on the basis of the classification of the respective section of the layout of the integrated circuit. The means for performing an automated layout construction process receive the selected one or more repair patterns and modify the layout of the integrated circuit on the basis of the selected one or more repair patterns for bringing the layout of the integrated circuit into conformity with the second set of design rules.

An illustrative computer-readable storage medium disclosed herein includes code for causing a computer to perform an automated layout construction process. The automated layout construction process creates a layout of an integrated circuit. The automated layout construction process is performed on the basis of a first set of design rules but not on the basis of a second set of design rules. Additionally, the code causes the computer to perform a pattern matching process for identifying one or more sections of the layout of the integrated circuit that match at least one member of a set of detection patterns. Each match is indicative of a design rule violation wherein at least one member of the second set of design rules is not satisfied. The code further causes the computer to classify the one or more sections of the layout of the integrated circuit and to provide one or more repair patterns for each of the one or more sections of the layout of the integrated circuit. The one or more repair patterns are provided on the basis of the classification of the respective section of the layout of the integrated circuit. Furthermore, the code causes the computer to modify the layout of the integrated circuit on the basis of the one or more repair patterns for bringing the layout of the integrated circuit into conformity with the second set of design rules.

BRIEF DESCRIPTION OF THE DRAWINGS

The disclosure may be understood by reference to the following description taken in conjunction with the accompanying drawings, in which like reference numerals identify like elements, and in which:

FIG. 15 schematically illustrates fat metal spacing rules;

FIGS. 16 and 17 schematically illustrate via to metal spacing rules;

Figure 1:
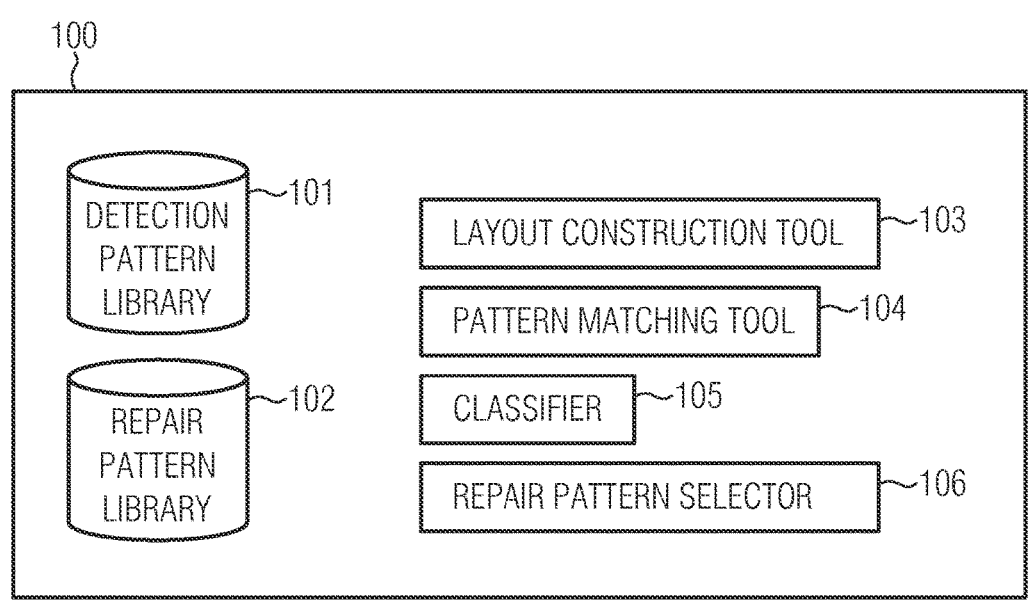
FIG. 1 shows a schematic block diagram of a computer system disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, an optimistic modeling of design rules is utilized for an automated layout construction process that may be performed by a layout construction tool. A plurality of design rules for an integrated circuit, which may, for example, be provided by a design rule manual for a technology employed in the manufacturing of the integrated circuit, is obtained. A part of the plurality of design rules is selected, and an automated layout construction process creating a layout of the integrated circuit is performed only on the basis of the unselected rest of the plurality of design rules. Therefore, it may occur that the layout created by the automated layout construction process does not satisfy all of the plurality of design rules, and violations of the selected part of the plurality of design rules may occur. If design rule violations occur, an automatic pattern matching algorithm may detect failing sections of the layout that include design rule violations. The failing sections of the layout may be automatically classified, and one or more repair patterns defining repair solutions may be selected for the failing sections of the layout, and fed back to the layout construction tool. The layout construction tool then performs the repair.

In some embodiments, the repair of the layout may be performed by means of a pattern replacement, wherein a fitting repair pattern is selected from a repair pattern library, and the layout construction tool replaces the failing section of the layout with the repair pattern. In other embodiments, the repair may employ a layout construction tool guidance. In such embodiments, a layout construction guidance including a set of repair patterns may be returned to the layout construction tool, which then performs the repair based on this guidance in the failing sections of the layout. After the repair, a layout of the integrated circuit that complies with each of the plurality of design rules, which include the second set of design rules that was not considered in the automated layout construction process, may be obtained.

The layout construction tool, when equipped only with the reduced set of design rules that is obtained by omitting the selected design rules from the plurality of design rules, may produce less pessimistic layouts of the integrated circuit, with faster convergence to a correct implementation with respect to the reduced set of design rules.

The design rules that are selected for omission from the set of design rules considered by the layout construction tool in the automated layout construction process can determine a set of detection patterns and a corresponding set of repair patterns that defines the possible layout repair solutions. If the created layout does not satisfy the omitted design rules, a pattern matching process wherein the detection patterns are used can identify the sections of the layout that include design rule violations. The matching sections of the layout can be mapped automatically to the set of repair patterns. The layout construction tool then performs the replacement of the sections of the layout and the repair on the basis of the repair patterns to obtain a layout of the integrated circuit that complies with each of the plurality of design rules.

The selection of design rules that are omitted from the plurality of design rules when the automated layout construction process is performed may, for example, be performed using the following criteria.

In some embodiments, design rules that cannot be modeled exactly with the layout tool design rule constructs provided by the layout construction tool and, thus, would need to be approximated pessimistically with other rule constructs, may be omitted.

In some embodiments, rules that are algorithmically expensive for the layout construction tools may be omitted. The selection of rules that are algorithmically expensive for the layout construction tool may be done by means of layout construction experiments. Additionally and/or alternatively, rules with a large or complex layout context in the precondition, which are typically algorithmically complex for the layout construction tool, may be omitted.

In some embodiments, rules whose omission accounts for a small to moderate number of design rule violations in generated layouts may be omitted.

Combinations of these criteria may also be employed.

Examples of design rules that may be omitted in the set of design rules considered by the layout construction tool may include via cluster and via cluster spacing rules, preferred/non-preferred direction fat metal spacing rules, via to metal spacing rules, for example, via-to-vertex spacing rules, complex multicut enclosure rules and/or dense end of line same mask spacing rules.

Compared to prior art methodologies as described above, techniques as disclosed herein may improve the layout construction process and result by omitting those of the design rules in the design rule manual from the automated layout construction process that can harm the layout construction automation. The detection and repair patterns may be derived from that rule selection. Thus, the detection and repair patterns may be optimized to detect and resolve exactly those layout issues that may occur because the selected design rules were omitted for the layout construction process.

Therefore, embodiments disclosed herein can enable the automatic creation of layouts with an improved global quality of results, for instance a higher utilization so that the layout occupies less area in silicon, or higher scores in design for manufacturing metrics.

FIG. 1 shows a schematic block diagram of a computer system 100 according to an embodiment. The computer system 100 includes a detection pattern library 101 and a repair pattern library 102. In some embodiments, the detection pattern library 101 and the repair pattern library 102 may be provided in the form of one or more databases storing detection patterns and repair patterns. The detection patterns and the repair patterns will be described in more detail below.

The computer system 100 further includes a layout construction tool 103. The computer system 100 may further include a pattern matching tool 104 that can check a layout of an integrated circuit provided by the layout construction tool 103 for compliance with a set of design rules. Additionally, the computer system 100 may include a classifier 105, that is configured for classifying sections of the layout of an integrated circuit violating a design rule that have been identified by the pattern matching tool 104, and a repair pattern selector 106. Features of the layout construction tool 103, the pattern matching tool 104, the classifier 105 and the repair pattern selector 106 will be described in more detail below.

The computer system 100 may include one or more conventional computers, each including a processor, volatile memory and nonvolatile memory. The computer system 100 may be connected to a computer network. The layout construction tool 103, the pattern matching tool 104, the classifier 105 and the repair pattern selector 106 may be provided in the form of code that can be executed by one or more processors of the computer system 100, thereby causing the computer system 100 to function as the layout construction tool 103, the pattern matching tool 104, the classifier 105 and the repair pattern selector 106. The detection pattern library 101 and the repair pattern library 102 may be stored in the computer system 100, wherein conventional techniques for storing data such as, for example, databases, may be employed. Code for causing a computer to function as the layout construction tool 103, the pattern matching tool 104, the classifier 105 and/or the repair pattern selector 106 may be stored on conventional storage media such as harddisks, solid state disks, memory cards, CDs and DVDs.

The layout construction tool 103 may be configured to perform an automated layout construction process that is employed in the physical design of an integrated circuit. The physical design may be performed on the basis of a netlist, which may be obtained by means of a synthesis process, wherein a register transfer level design is converted to gate level descriptions of the integrated circuit. The physical design may include steps of floor planning, partitioning, placement, clock tree synthesis and routing. In particular, the layout construction tool 103 may be configured to perform a routing, wherein circuit features that are employed for providing electrical connections between circuit elements of an integrated circuit are designed. These circuit features may include electrically conductive metal lines and contact vias filled with a metal that can provide electrical connections between metal lines in different interconnect layers. Further features of the layout construction tool 103 may correspond to features of conventional layout construction tools.

The layout construction tool 103 may be configured to perform the automated layout construction process on the basis of a first set of design rules. The first set of design rules may be a reduced set of design rules that is obtained by omitting selected design rules from a plurality of design rules for an integrated circuit, as mentioned above, and as described in more detail below. A second set of design rules, which includes the selected design rules, is not considered by the automatic layout construction process performed by the layout construction tool 103, so that the automated layout construction process is not based on the second set of design rules.

The pattern matching tool 104 can perform a pattern matching process for identifying one or more sections of the layout of the integrated circuit that was created in the automated layout construction process performed by the layout construction tool 103 that match at least one member of the set of detection patterns stored in the detection pattern library 101. The detection patterns may be configured such that matches found in the pattern matching process are indicative of design rule violations wherein at least one member of the plurality of design rules, in particular one of the selected design rules, is not satisfied.

The one or more sections of the layout of the integrated circuit identified by the pattern matching tool 104 may be classified by the classifier 105. In some embodiments, the classifier 105 can classify each of the one or more sections of the layout of the integrated circuit identified by the pattern matching tool 104 into a class. For example, sections of the layout of the integrated circuit that are substantially mirror symmetrical to each other and/or rotationally symmetrical to each other may be classified into a same class. Furthermore, identified sections of the layout of the integrated circuit that are relatively similar to each other may be classified into a same class.

The repair pattern selector 106 may select one or more of the repair patterns in the repair pattern library 102 for each of the one or more sections of the layout of the integrated circuit that were identified by the pattern matching tool 104. The selection of the one or more repair patterns may be based on the classification of the sections of the layout of the integrated circuit that was performed by the classifier 105. For example, each of the classes may have one or more repair patterns associated therewith, and the repair pattern selector 106 can return the repair patterns associated with the class of the respective section of the layout of the integrated circuit for each of the sections of the layout of the integrated circuit that were identified by the pattern matching tool 104.

The layout construction tool 103 may receive the one or more repair patterns selected by the repair pattern selector 106 and modify the layout of the integrated circuit for bringing the layout of the integrated circuit into conformity with the plurality of design rules that were provided for the integrated circuit, in particular into conformity with the second set of design rules that was not considered in the automated layout construction process. Thus, a modified layout of the integrated circuit that is in conformity with each of the plurality of design rules can be obtained.

In the following, methods according to embodiments will be described with reference to FIGS. 2-10. In some embodiments, the methods described in the following may be performed using the computer system 100 described above with reference to FIG. 1.

Figure 2:
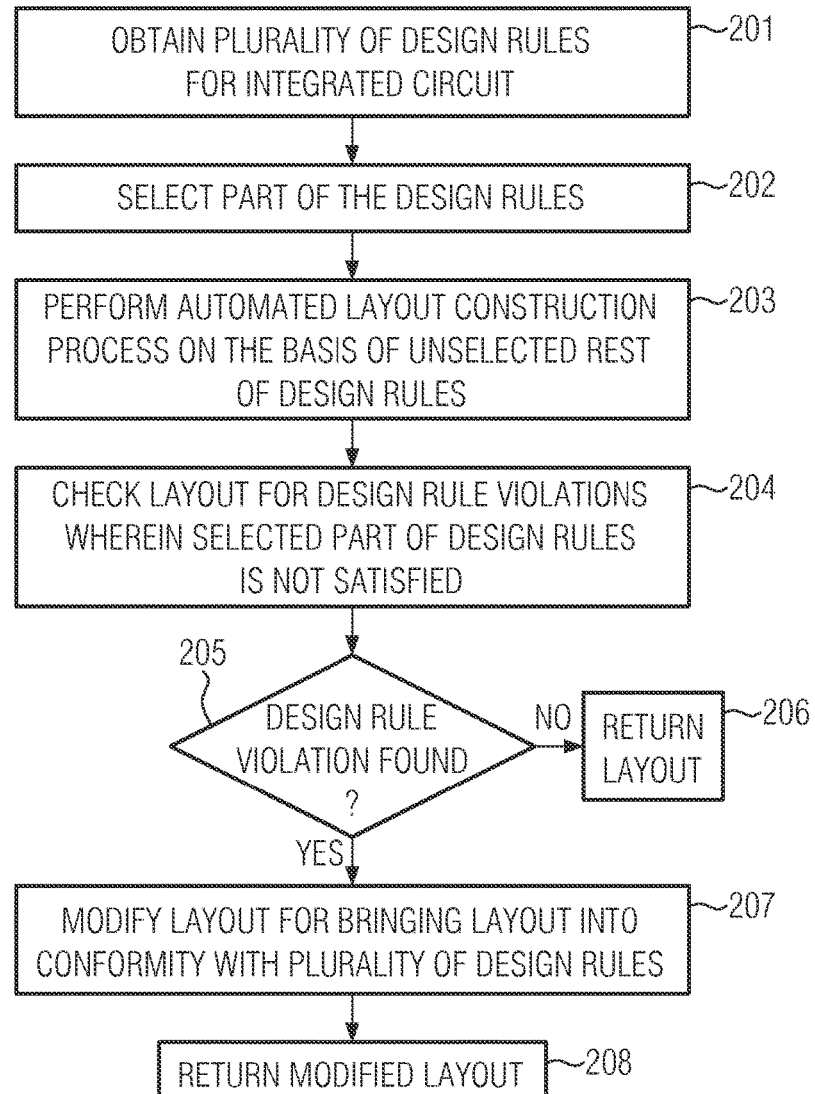
FIGS. 2-10 show flow diagrams illustrating methods disclosed herein.

FIG. 2 shows a general flow diagram of a method according to an embodiment. At 201, a plurality of design rules for an integrated circuit is obtained, for example, in the form of a design rule manual provided by a foundry for the manufacturing of integrated circuits. At 202, a part of the plurality of design rules obtained at 201 may be selected. Based on the selection of a part of the plurality of design rules, a first set of design rules and a second set of design rules may be formed, wherein the selected part of the plurality of design rules is included into the second set of design rules and the unselected rest of the plurality of design rules is included into the first set of design rules. Criteria for the selection of design rules and methods that may be employed for the selection of design rules will be described in more detail below.

At 203, an automated layout construction process is performed. In embodiments wherein the computer system 100 described above with reference to FIG. 1 is used, the automated layout construction process may be performed by means of the layout construction tool 103. The automated layout construction process may include techniques for the physical design of an integrated circuit as described above. In the automated layout construction process, a layout of the integrated circuit may be created. The layout created in the automated layout construction process can define an arrangement and geometrical properties of circuit features of the integrated circuit, wherein the circuit features may include, for example, electrically conductive metal lines and contact vias providing electrical connections between the metal lines, as well as circuit elements such as transistors, capacitors, resistors and/or diodes. The layout created in the automated layout construction process may be used as a basis for forming photomasks which may be used in photolithography processes employed for patterning materials in the formation of the integrated circuit.

The automated layout construction process may be performed on the basis of the first set of design rules that include those design rules that were not selected in the selection of a part of the plurality of design rules for the integrated circuit performed at 202. The design rules of the first set of design rules may be provided to the layout construction tool 103 in a modeling language wherein the design rules are expressed in terms of design rule constructs provided by the layout construction tool 103, in accordance with conventional techniques for the automatic creation of layouts of integrated circuits.

At 204, the layout of the integrated circuit created by the automated layout construction process may be checked for design rule violations. In embodiments wherein the computer system 100 described above with reference to FIG. 1 is used, the check of the layout for design rule violations performed at 204 may be carried out by the pattern matching tool 104.

As mentioned above, when performing the automated layout construction process at 203, only the first set of design rules is provided to the layout construction tool 103, but not the second set of design rules. Therefore, the created layout may include design rule violations wherein one or more of the design rules from the second set of design rules are not satisfied. In the checking of the layout for design rule violations, one or more sections of the layout that may include a violation of one or more of the design rules from the second set of design rules can be identified.

In some embodiments, the checking of the layout of the integrated circuit for design rule violations wherein at least one member of the second set of design rules is not satisfied may be performed as described in the following with reference to FIG. 3.

Figure 3:
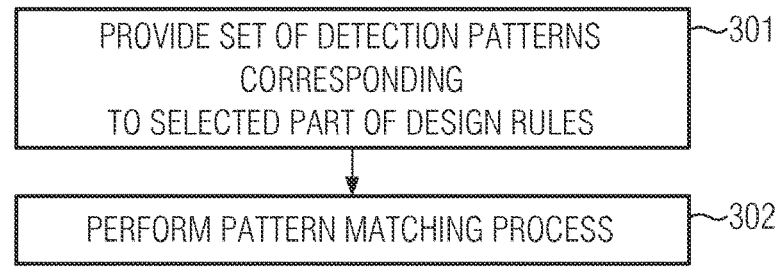

FIG. 3 shows a schematic flow diagram illustrating steps that may be performed for checking the layout of the integrated circuit for design rule violations. At 301, a set of detection patterns is provided. The detection patterns may be provided on the basis of the design rules from the second set of design rules that was not considered in the automated layout construction process. In embodiments wherein the computer system 100 described above with reference to FIG. 1 is used, the set of detection patterns may be provided in the form of the detection pattern library 101 described above.

In some embodiments, each of the detection patterns may include an exemplary circuit layout section that is not in conformity with at least one of the members of the second set of design rules. In some embodiments, the detection patterns may be provided in a format substantially corresponding to a format employed for the layout of the integrated circuit created in the automated layout construction process. In some embodiments, each of the detection patterns may include an image of an exemplary circuit layout section that is not in conformity with at least one of the design rules of the second set of design rules. In other embodiments, each of the detection patterns may include a parameterized layout topology description matching layout sections with a similar topology that are not in conformity with at least one of the design rules. In such embodiments, the detection patterns may describe layout dimensions as sets of ranges, such that layout sections having dimensions which fall in the range match the pattern. In further embodiments, a part of the detection patterns may include images of exemplary layout sections that are not in conformity with at least one of the design rules, whereas other ones of the detection patterns include parameterized topology descriptions.

At 302, a pattern matching process is performed for identifying one or more sections of the layout of the integrated circuit that match at least one member of the set of detection patterns. The pattern matching process can compare the layout of the integrated circuit with each of the detection patterns in the detection pattern library 101, and can identify sections of the layout of the integrated circuit that match the respective detection pattern. A match between a detection pattern and a section of the layout of the integrated circuit may be a substantially exact match, wherein the section of the layout of the integrated circuit substantially corresponds to the detection pattern, or the match between the section of the layout of the integrated circuit and the detection pattern may be a fuzzy or inexact match, wherein the section of the layout of the integrated circuit deviates from the detection pattern to a certain extent.

For example, detection patterns in the detection pattern library 101 can specify a so-called "don't care area," wherein a detection pattern and a section of the layout are determined to match if deviations between the section of the layout and the detection pattern are present substantially only in the don't care area. Additionally, or alternatively, in the pattern matching process, a measure of a deviation between the detection pattern and the section of the layout may be determined, and the section of the layout may be identified as a section matching the detection pattern if the determined measure of the deviation is smaller than a threshold value. For example, a section of the layout may be identified as matching a particular detection pattern if there are deviations between the section of layout and the detection pattern in only a small fraction of the area of the detection pattern.

Further features of the pattern matching process performed at 302 may correspond to features of conventional pattern matching processes employed in known electronic design automation processes as disclosed, for example, in U.S. Pat. Nos. 8,429,582 and 8,418,105, the disclosure of which is incorporated herein by reference.

Referring to FIG. 2 again, at 205, it is determined if a design rule violation was found in the check of the layout for design rule violations performed at 204, as described above. If no design rule violation has been found, i.e., no section of the layout matching one or more of the detection patterns was found, at 206, the layout created in the automated layout construction process at 203 may be output for use in the manufacturing of the integrated circuit.

In some embodiments, the second set of design rules may include design rules wherein violations of the design rules are relatively rare, even if the automated layout construction process is performed without considering the respective design rules. In such embodiments, obtaining a layout of the integrated circuit that is in conformity with each of the plurality of design rules in the automated layout construction process may be relatively likely, although the design rules of the second set of design rules are not considered in the automated layout construction process.

However, due to the omission of the design rules in the second set of design rules, a smaller number of constraints is imposed to the automated layout construction process, which can lead to a faster convergence of the automated layout construction process and/or to an improved layout, which may have advantages compared to a layout obtained by means of an automated layout construction process wherein each of the plurality of design rules is considered, for example, in terms of a smaller wafer area required for the integrated circuit, a greater speed of operation of the integrated circuit and/or a higher score in design for manufacturing measures.

If design rule violations have been found in the check of the layout for design rule violations, the method continues at 207, where the layout of the integrated circuit is modified for bringing the layout of the integrated circuit into conformity with each of the plurality of design rules, in particular into conformity with each of the members of the second set of design rules. Thereafter, at 208, the modified layout of the integrated circuit may be output, and the modified layout may be used for the manufacturing of the integrated circuit.

For manufacturing the integrated circuit on the basis of the layout created in the automated layout construction process output at 206, or for manufacturing the integrated circuit on the basis of the modified layout output at 208, conventional techniques for the manufacturing of integrated circuits may be employed. In particular, photomasks may be formed on the basis of the layout output at 206 or on the basis of the modified layout output at 208, respectively, and the photomasks may be used in photolithography processes that are employed for patterning materials.

Figure 4:
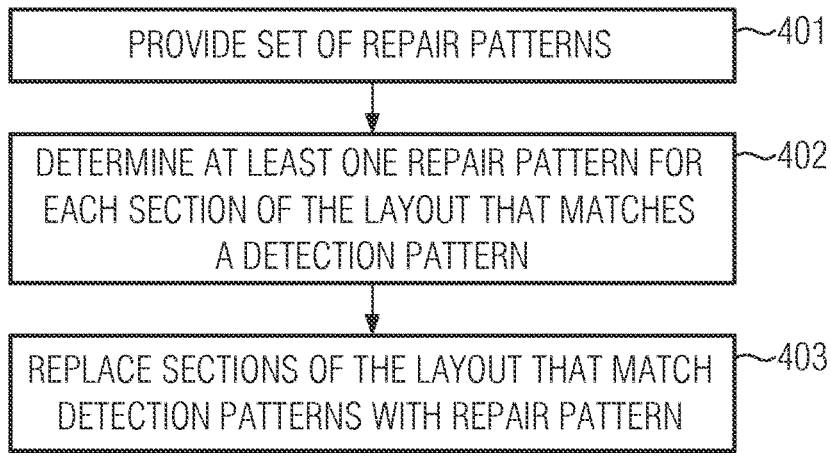

FIG. 4 shows a schematic flow diagram illustrating how the modification of the layout for bringing the layout into conformity with each of the plurality of design rules may be performed in embodiments. At 401, a set of repair patterns is provided. In embodiments wherein the computer system 100 described above with the reference to FIG. 1 is used, the set of repair patterns may be provided in the repair pattern library 102. In some embodiments, each of the repair patterns may define a section of a layout of the integrated circuit that is in conformity with each of the plurality of design rules, in particular, in conformity with each of the members of the second set of design rules that were not considered in the automated layout construction process, and may be used as a replacement of a section of the layout of the integrated circuit that includes a design rule violation wherein one or more of the plurality of design rules are not fulfilled.

In some embodiments, the repair patterns may be provided on the basis of detection patterns that are used for checking the layout of the integrated circuit for design rule violations. As described above, the detection patterns may include exemplary circuit layout sections that are not in conformity with one or more of the members of the second set of design rules. For providing the repair patterns, circuit layout sections represented by the detection patterns may be modified. The modification of a circuit layout section performed for providing a repair pattern may include a removal of one or more circuit features, an addition of circuit features, moving one or more circuit features and/or changing a shape of one or more of the circuit features. Examples of modifications of circuit layout sections that may be performed for providing repair patterns will be described below.

In some embodiments, the provision of the repair patterns may be performed by an operator. For this purpose, the computer system 100 may provide a graphical user interface that allows the operator to load and modify circuit layout sections, and to store them as repair patterns in the repair pattern library 102.

Further referring to FIG. 4, at 402, at least one repair pattern is determined for each section of the layout that matches a detection pattern. In embodiments wherein the computer system 100 described above with reference to FIG. 1 is employed, this may be done by the repair pattern selector 106. Techniques that may be used for determining the at least one repair pattern will be described below.

Thereafter, at 403, each section of the layout of the integrated circuit that matches a detection pattern may be replaced with one of the at least one repair pattern determined for the respective section of the layout at 402. In embodiments wherein the computer system 100 described above with reference to FIG. 1 is employed, this may be done by the layout construction tool 103.

In the following, further embodiments for performing the modification of the layout of the integrated circuit that is performed at 207 in the method described above with reference to FIG. 2 will be described with reference to FIG. 5. At 501, a set of repair patterns is provided. Similar to the embodiments described above with reference to FIG. 4, the repair patterns may be provided by modifying circuit layout sections including design rule violations, as represented by the detection patterns.

Similar to the embodiments described above with reference to FIG. 4, the modifications of the circuit layout sections may include adding, removing and/or moving circuit features, and/or changing a shape of circuit features. In addition thereto, the modifications of the circuit layout sections may include a provision of blockages. A blockage may define an area in the layout of the integrated circuit wherein no circuit features, or no circuit features of a particular type, are to be placed. For example, a blockage may define that no metal line and/or no contact via is to be placed in a particular area. Repair patterns including blockages may be used if one of the members of the second set of design rules is violated due to a too close spacing between two circuit features. In the repair pattern, one of the circuit features that are too close to each other may be removed, and a blockage may be provided in a vicinity of the other circuit feature for specifying that no circuit feature, or no circuit feature of a particular type, is to be placed at this location.

Figure 5:
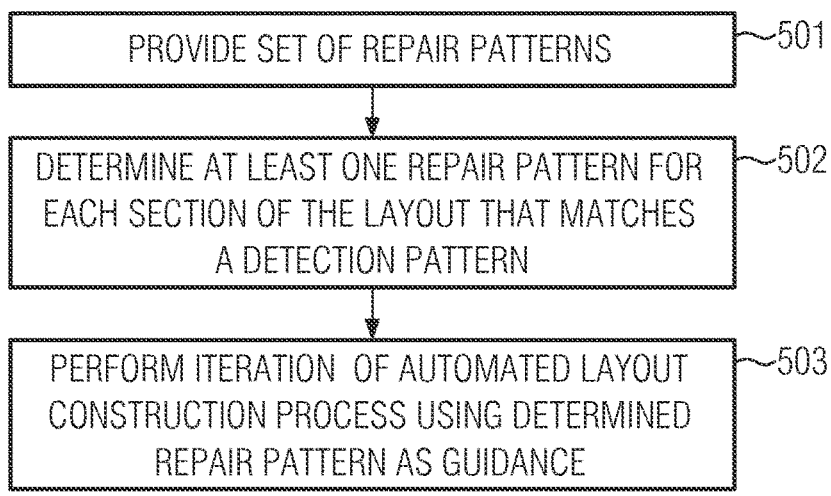

Further referring to FIG. 5, at 502, at least one repair pattern is determined for each section of the layout that matches a detection pattern. This may be done similar to the determination of at least one repair pattern at 402 in the embodiments described above with reference to FIG. 4, and will be described in more detail below. For each section of the layout of the integrated circuit that matches a detection pattern, one or more repair patterns may be provided, wherein the repair patterns may include repair patterns that can be used as a replacement of a section of the layout of the integrated circuit that includes a design rule violation, as described above with reference to FIG. 4, and/or repair patterns including blockages as described above.

Thereafter, at 503, an iteration of the automated layout construction process may be performed. In embodiments wherein the computer system 100 described above with reference to FIG. 1 is employed, this may be done by the layout construction tool 103. The iteration of the automated layout construction process need not be performed for the entire integrated circuit. Instead, the iteration of the automated layout construction process may be performed only for parts of the layout of the integrated circuit that include a layout section that violates one or more of the plurality of design rules. For example, in the iteration of the automated layout construction process, the layout of the integrated circuit may be rebuilt in local environments of the sections of the layout that include one or more design rule violations, whereas portions of the layout of the integrated circuit that are located at a distance to sections of the layout that include a design rule violation may be maintained.

In the iteration of the automated layout construction process, the at least one member of the set of repair patterns that was determined for each of the identified sections of the layout of the integrated circuit that match a detection pattern may be used as a guidance. In doing so, the layout of the integrated circuit is rebuilt in the environment of the sections of the layout that include design rule violations under the constraint that one of the at least one repair pattern is provided at the location of the respective section of the layout. If one of the repair patterns includes a blockage, the automated layout construction process can rebuild the environment of the section of the layout under the constraint that no circuit feature, or no circuit feature of a particular type, is provided at the location of the blockage. The automated layout construction process can move and/or rearrange circuit features in the environment of the section of the layout in such a manner that the constraint defined by the presence of the blockage is fulfilled, while maintaining the functionality of the integrated circuit defined by the layout.

Further embodiments can combine features of the embodiments described above with reference to FIG. 4 and the embodiments described above with reference to FIG. 5. For example, in some embodiments, a section of the layout of the integrated circuit that includes a design rule violation may be replaced by the repair pattern if only one repair pattern that does not include a blockage is provided for the respective section of the layout, and an iteration of the automated layout construction process may be performed for an environment of a section of the layout that includes a design rule violation, if a plurality of repair patterns is determined for the layout section and/or if one or more repair patterns including a blockage are determined for the section of the layout.

Figure 6:
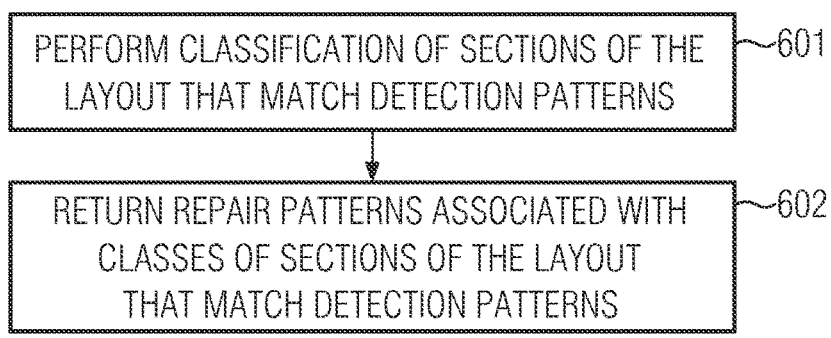

FIG. 6 shows a schematic flow diagram illustrating how at least one member of the set of repair patterns may be determined for each of the one or more sections of the layout of the integrated circuit that includes a design rule violation. Techniques as described in the following with reference to FIG. 6 may be performed at 402 and 502 in the embodiments described above with reference to FIGS. 4 and 5. At 601, a classification of sections of the layout of the integrated circuit that match detection patterns may be performed. In some embodiments, sections of the layout that match detection patterns that are substantially mirror symmetrical and/or rotationally symmetrical with respect to each other may be classified into a same class. Additionally and/or alternatively, the sections of the layout may be classified in accordance with requirements relating to possible repair solutions that may be employed for fixing the violation of design rules in the sections of the layout. For example, providing a blockage in a vicinity of a circuit feature of a particular type, for example a metal line, may be used to address different design rule violations wherein other circuit features are located too close to the circuit feature. In some embodiments, sections of the layout of the integrated circuit that match a group of detection patterns that are suitable for detecting design rule violations that may be addressed by providing blockages in the vicinity of the circuit feature may be classified into a same class.

For performing the classification of sections of the layout, each of the detection patterns may be associated with a particular class. The association between the detection patterns and the classes may be provided by an operator using a user interface of the computer system 100, and may be stored in the detection pattern library 101. If a section of the layout of the integrated circuit is found to match a particular detection pattern in the pattern matching process performed at 302 in the methods described above with reference to FIG. 3, the section of the layout may be automatically classified into the class associated with the respective detection pattern.

At 602, repair patterns associated with the classes of the sections of the layout that match detection patterns may be returned. This may be done by looking up repair patterns, for example in the repair pattern library 102 described above with reference to FIG. 1, that are associated with the classes of sections of the layout of the integrated circuit.

The present disclosure is not limited to embodiments wherein a classification of sections of the layout is performed. In other embodiments, one or more repair patterns may be individually associated with each of the detection patterns. In such embodiments, at least one repair pattern may be determined for each of the layout sections matching one of the detection patterns by returning the one or more repair patterns associated with the respective detection pattern. The association between detection patterns and repair patterns may be provided by an operator, using a user interface of the computer system 100, and may be stored in the detection pattern library 101.

In the following, techniques that may be used for selecting the part of the plurality of design rules that is included into the second set of design rules which is not considered in the automated layout construction process performed at 202 in the methods described above with reference to FIG. 2 will be described with reference to FIGS. 7-10. In some embodiments, all of the techniques for selecting the part of the plurality of design rules described in the following may be used in combination with each other. In other embodiments, only a subset of the techniques described in the following may be employed.

Figure 7:
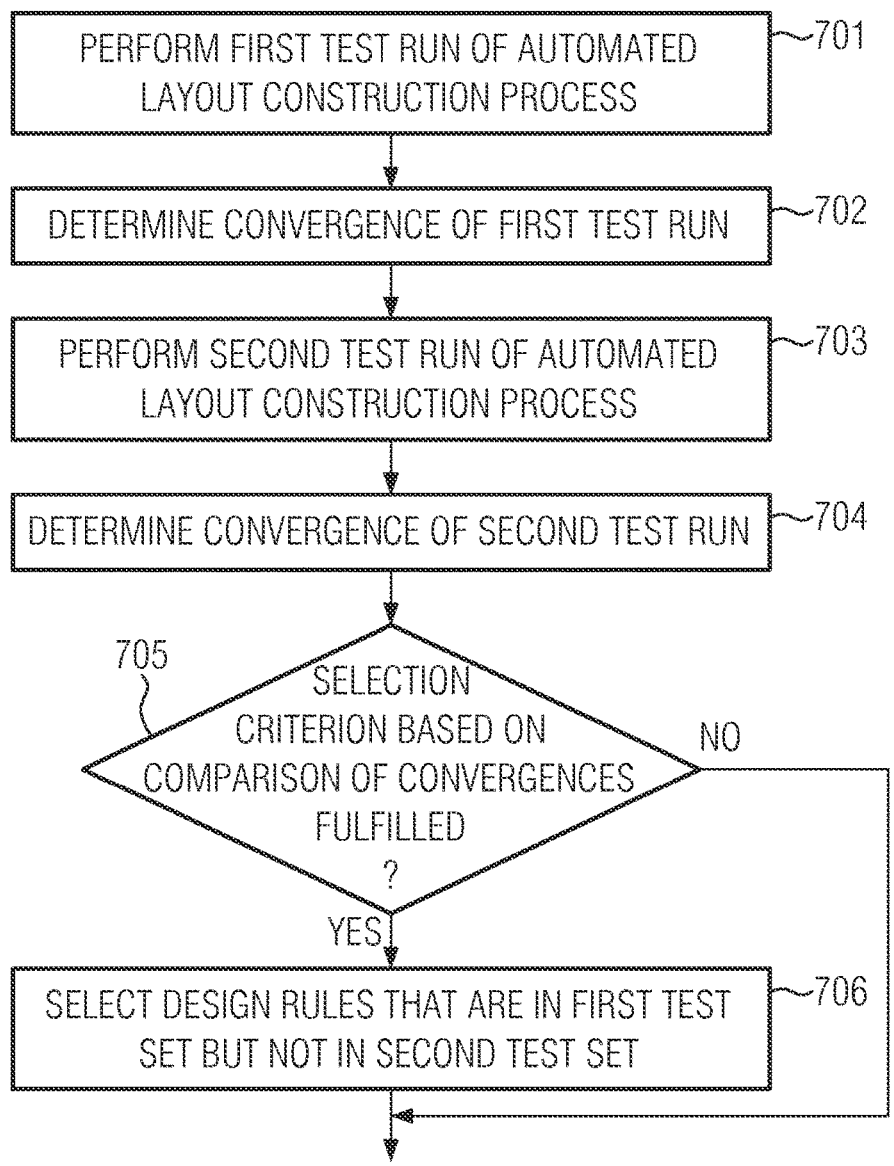

FIG. 7 shows a flow diagram illustrating techniques according to embodiments for selecting the part of the plurality of design rules that is included into the second set of design rules. At 701, a first test run of the automated layout construction process is performed. The first test run of the automated layout construction process may be performed on the basis of a first test set of design rules. In some embodiments, the first test set may include each of the plurality of design rules for the integrated circuit obtained at 201, as described above with reference to FIG. 2. In other embodiments, the first test set may include only a part of the plurality of design rules. For example, design rules that have already been selected for inclusion into the second set of design rules using one of the other techniques described below, or in an earlier run of the method according to FIG. 7, may be omitted from the first test set.

The first test run of the automated layout construction process need not be performed for the entire integrated circuit. Instead, the first test run may be performed for only a part of the integrated circuit. In other embodiments, however, the first test run may be performed for the entire integrated circuit. Furthermore, in the first test run, the creation of a layout of the integrated circuit or the portion thereof, respectively, need not be completed. In embodiments wherein the automated layout construction process includes an iterative optimization process, only a few steps of the automated layout construction process may be performed.

At 702, a convergence of the first test run may be determined. For determining the convergence of the first test run, a number of steps of the automated layout construction process may be performed. After each step, a number of remaining errors of the layout of the integrated circuit may be determined. The convergence may be determined as a gradient of the number of remaining errors of the layout with respect to the number of steps of the automated layout construction process performed, wherein a greater absolute value of the gradient is obtained in the case of a faster convergence of the automated layout construction process.

At 703, a second test run of the automated layout construction process may be performed. Features of the second test run of the automated layout construction process may correspond to those of the first test run wherein, however, in the second test run, a second test set of design rules is used instead of the first test set that was used in the first test run. The second test set is a strict subset of the first test set. Accordingly, the first test set includes each of the design rules of the second test set, but the first test set also includes one or more design rules that are not in the second test set. Thus, the second test run of the automated layout construction process is performed on the basis of a smaller number of design rules than the first test run.

At 704, a convergence of the second test run may be determined. This may be done similar to the determination of the convergence of the first test run performed at 702 described above.

At 705, it is determined if a selection criterion that is based on a comparison of the convergences of the first and the second test runs is fulfilled. If the first test set of design rules includes one or more design rules that adversely affect the convergence of the automated layout construction process, for example, because they are algorithmically expensive for the layout construction tool 103 that performs the automated layout construction process, the convergence of the first test run of the automated layout construction process may be relatively slow. If the algorithmically expensive design rules in the first test set are not included in the second test set, a faster convergence may be obtained in the second test run of the automated layout construction process. Accordingly, comparing the convergence of the first and the second test runs of the automated layout construction process can help to determine if those of the design rules in the first test set that are not present in the second test set are algorithmically expensive for the layout construction tool and adversely affect the convergence of the automated layout construction process.

In some embodiments, the selection criterion may include a comparison of the difference between the convergences of the second and the first test runs of the automated layout construction process with a threshold value, wherein the selection criterion is fulfilled if the difference between the convergence of the first test run and the convergence of the second test run is greater than the threshold value.

If the selection criterion is fulfilled, at 706, those design rules that are in the first test set but not in the second test set are selected and included into the second set of design rules that is not considered in the automated layout construction process performed at 203 in the method described above with reference to FIG. 2. Otherwise, the design rules that are in the first test set but not in the second test set may be included into the first set of design rules, or they may be investigated using one or more of the techniques described below with reference to FIGS. 8-10.

In some embodiments, a plurality of different first and second test sets of design rules may be formed, and steps 701 to 706 may be performed for each of the plurality of different first and second test sets of design rules. Thus, an influence of a number of different design rules on the convergence of the automated layout construction process may be assessed, and a number of design rules that adversely affect the convergence of the automated layout construction process may be identified and selected for inclusion into the second set of design rules.

Figure 8:
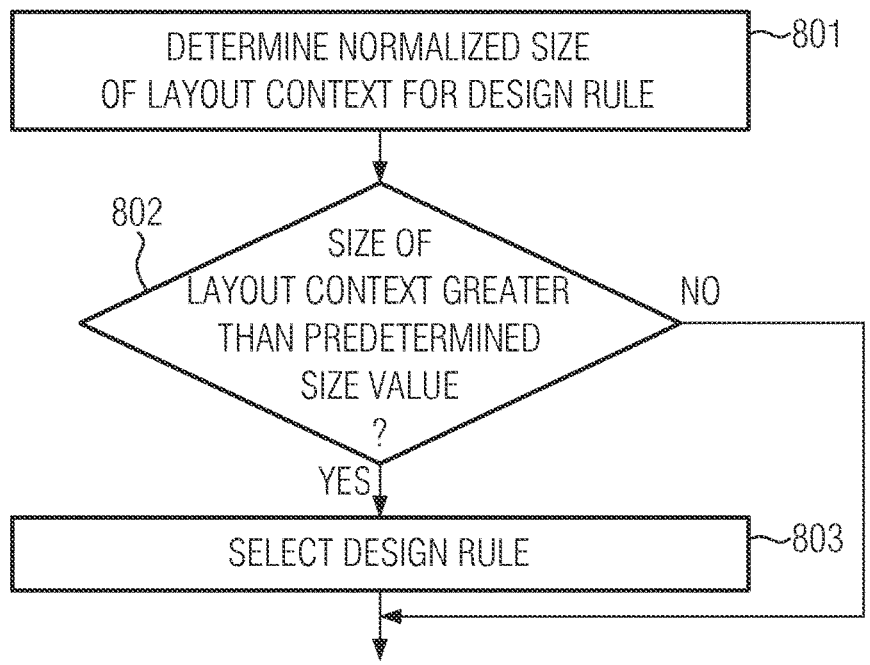

FIG. 8 shows a schematic flow diagram of another technique that may be used for selecting a part of the plurality of design rules for inclusion into the second set of design rules that is not considered in the automated layout construction process. At 801, a normalized size of a layout context is determined for a design rule from the plurality of design rules. The layout context of a design rule is an area of the layout of the integrated circuit that needs to be investigated for determining if the design rule is fulfilled or violated. For example, if a design rule defines a spacing between a first and a second circuit feature, the layout context of the design rule may include the area wherein the first and the second circuit feature are arranged. The size of the layout context may be provided in the form of a maximum diameter of the layout context. The normalized size is a quotient of the absolute size divided by the minimum spacing requirements of the involved layers.

At 802, it is determined if the size of the layout context is greater than a predetermined size value. If the size of the layout context is greater than the predetermined size value, at 803, the design rule is selected for inclusion into the second set of design rules. If the size of the layout context is smaller than the predetermined size value, the design rule may be included into the first set of design rules, or it may be investigated using one or more of the other techniques described with reference to FIGS. 7, 9 and 10.

Steps 801 to 803 may be performed for each of the design rules of the plurality of design rules for the integrated circuit. Thus, design rules having a large layout context, the consideration of which may be algorithmically expensive for the layout construction tool 103, may be selected for inclusion into the second set of design rules.

Figure 9:
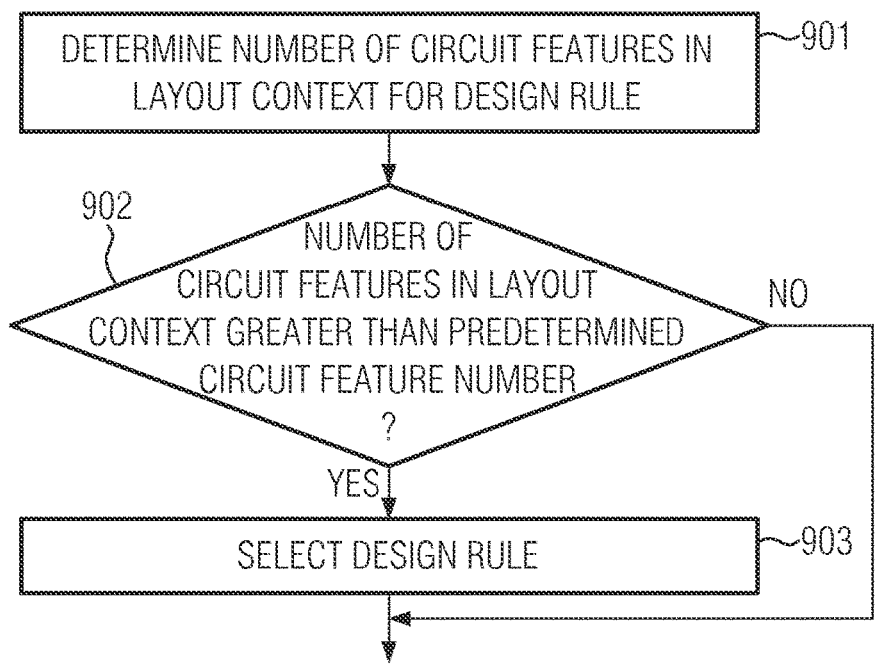

FIG. 9 shows a flow diagram illustrating further techniques that may be used for selecting a part of the plurality of design rules for inclusion into the second set of design rules that is not considered in the automated layout construction process. At 901, a number of circuit features in a layout context of a design rule from the plurality of design rules is determined. At 902, it is determined if the number of circuit features in the layout context is greater than a predetermined circuit feature number. If the number of circuit features in the layout context is greater than the predetermined circuit feature number, at 903, the design rule is selected for inclusion into the second set of design rules. Otherwise, the design rule may be included into the first set of design rules, or it may be assessed with another one of the techniques for selecting design rules described with reference to FIGS. 7, 8 and 10.

Steps 901 to 903 may be performed for each of the design rules of the plurality of design rules for the integrated circuit. Thus, design rules having a large layout context, the consideration of which may be algorithmically expensive for the layout construction tool 103 in the automated layout construction process, may be selected for inclusion into the second set of design rules.

Figure 10:
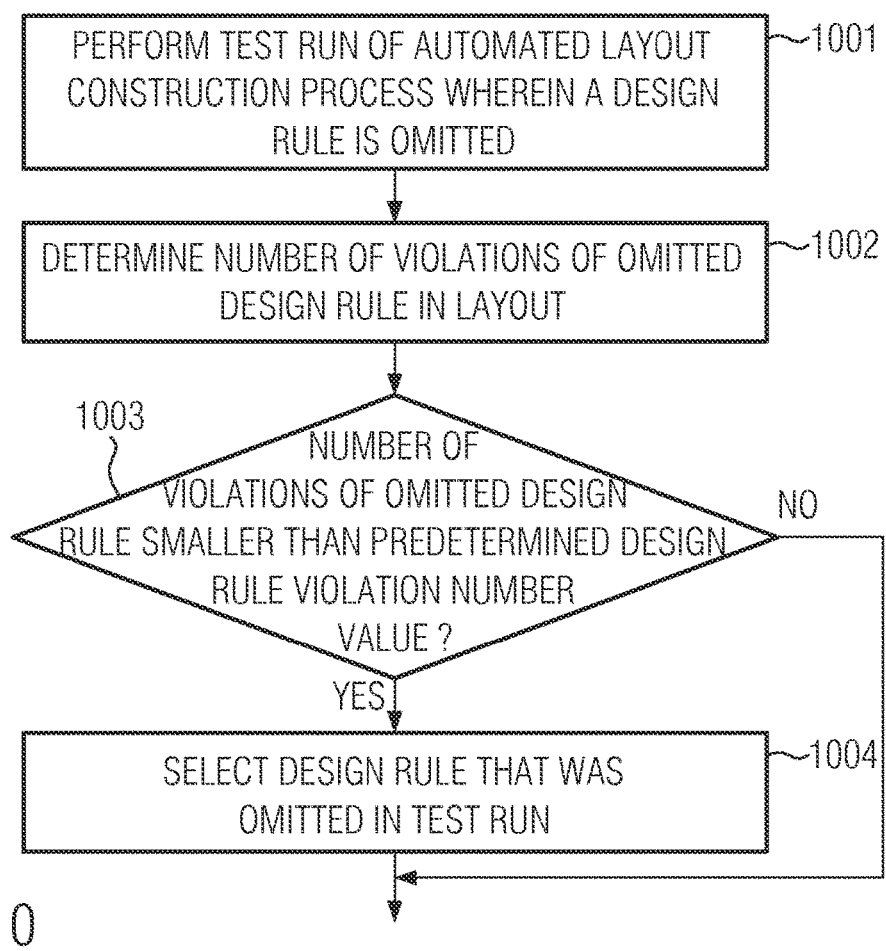

FIG. 10 shows a flow diagram illustrating further techniques that may be used for selecting a part of the plurality of design rules for the integrated circuit for inclusion into the second set of design rules that is not considered in the automated layout construction process. At 1001, a test run of the automated layout construction process is performed, wherein one of the design rules of the plurality of design rules is omitted. The other ones of the plurality of design rules for the integrated circuit may be considered in the test run of the automated layout construction process. The test run of the automated layout construction process need not be performed for the entire integrated circuit. Instead, the test run of the automated layout construction process may be performed for only a part of the integrated circuit. Thus, a computing time required for the test run of the automated layout construction process may be reduced substantially compared to an automated layout construction process wherein a layout of the entire integrated circuit is created.

At 1002, a number of violations of the design rule omitted in the test run may be determined for the portion of the integrated circuit for which the test run of the automated layout construction process was performed. This may be done by means of a pattern matching process using one or more detection patterns that are suitable for detecting sections of the layout that include a design rule violation.

At 1003, it is determined if the number of violations of the omitted design rule is smaller than a predetermined design rule violation number value. If this is the case, at 1004, the design rule that was omitted in the test run is selected for inclusion into the second set of design rules. Thus, design rules whose omission accounts for only a small number of design rule violations may be included into the second set of design rules. Otherwise, the design rule may be included into the first set of design rules, or it may be investigated by means of another one of the techniques for selecting design rules for inclusion into the second set of design rules described with reference to FIGS. 7-9.

In some embodiments, the techniques described above with reference to FIGS. 7-10 may be performed under the control of an operator using the computer system 100 described above with reference to FIG. 1. In other embodiments, one or more of the techniques may be carried out substantially automatically by the computer system 100. In some embodiments, the computer system 100 may substantially automatically process the plurality of design rules for the integrated circuit, which may be supplied to the computer system 100 in an appropriate machine readable form.

In further embodiments, the selection of a part of the rules from the plurality of design rules for the integrated circuit may be performed manually by an operator. A manual selection of design rules for inclusion into the second set of design rules need not be performed in accordance with the techniques described above with reference to FIGS. 7-10. In other embodiments, for example, the operator may select design rules from the plurality of design rules that cannot be modeled exactly with design rule constructs provided by the layout construction tool 103, and may include these design rules into the second set of design rules.

In the following, examples of design rules, detection patterns and repair patterns will be described with reference to FIGS. 11-19.

Figure 11:
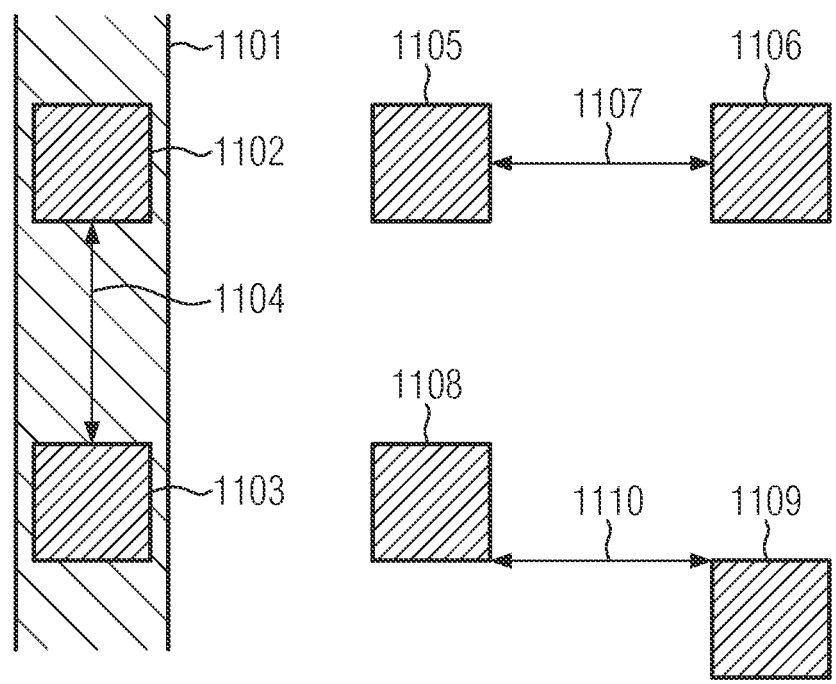
FIG. 11 schematically illustrates design rules relating to spacings between contact vias.

FIG. 11 illustrates examples of design rules relating to spacings between contact vias 1102, 1103, 1105, 1106, 1108, 1109. The design rules can define minimum values 1104, 1107, 1110 of spacings between the contact vias 1102, 1103, 1105, 1106, 1108, 1109, which can depend on whether the contact vias are arranged along a metal line 1101 or not, and on the relative orientation of the positions of the contact vias with respect to each other.

In some embodiments, design rules as illustrated in FIG. 11 may be included into the first set of design rules that is considered in the automated layout construction process performed at 203 in the methods described above with reference to FIG. 2.

Figure 12A:
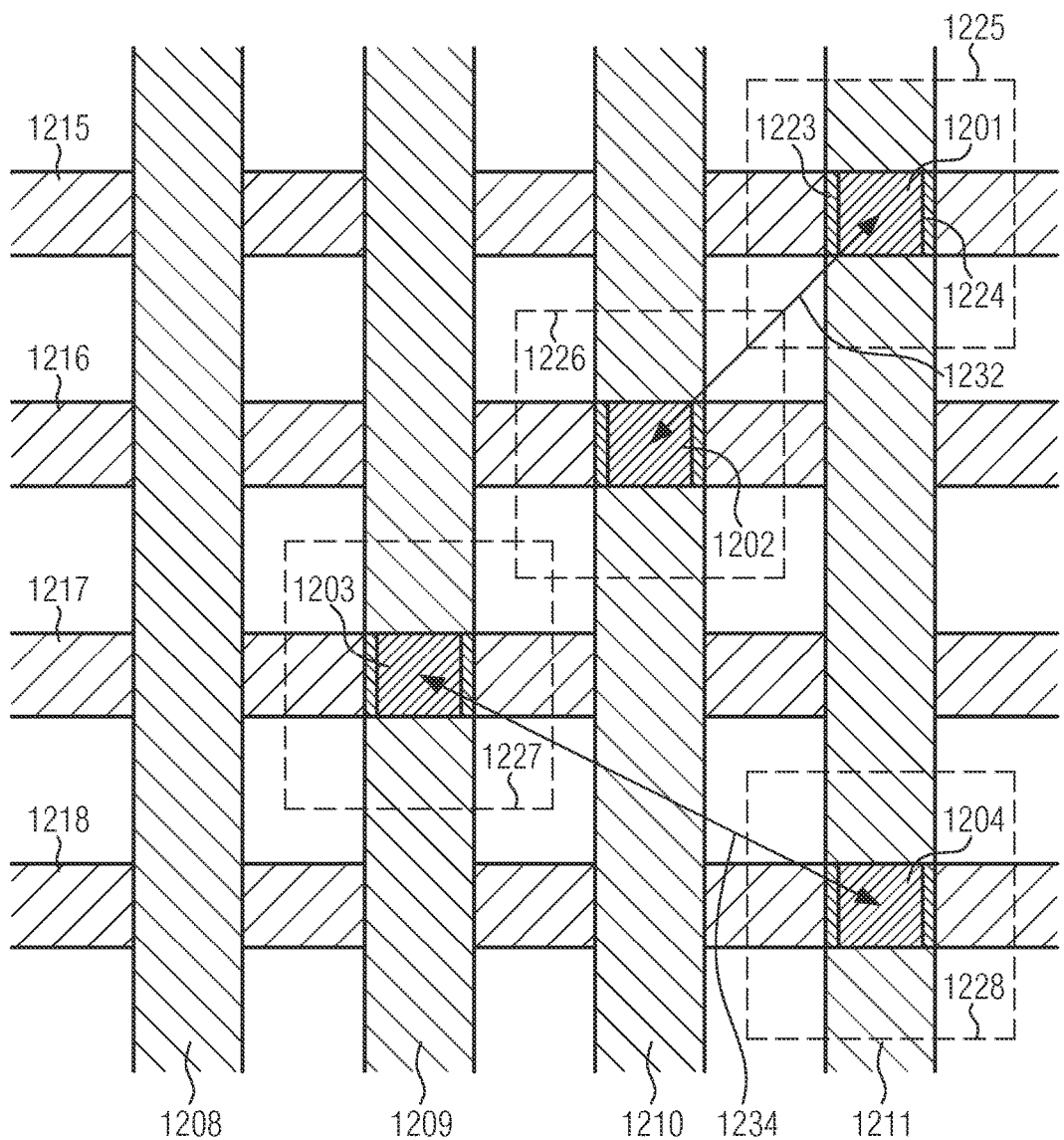
FIGS. 12a and 12b schematically illustrate via cluster spacing rules and via cluster rules.
Figure 12B:
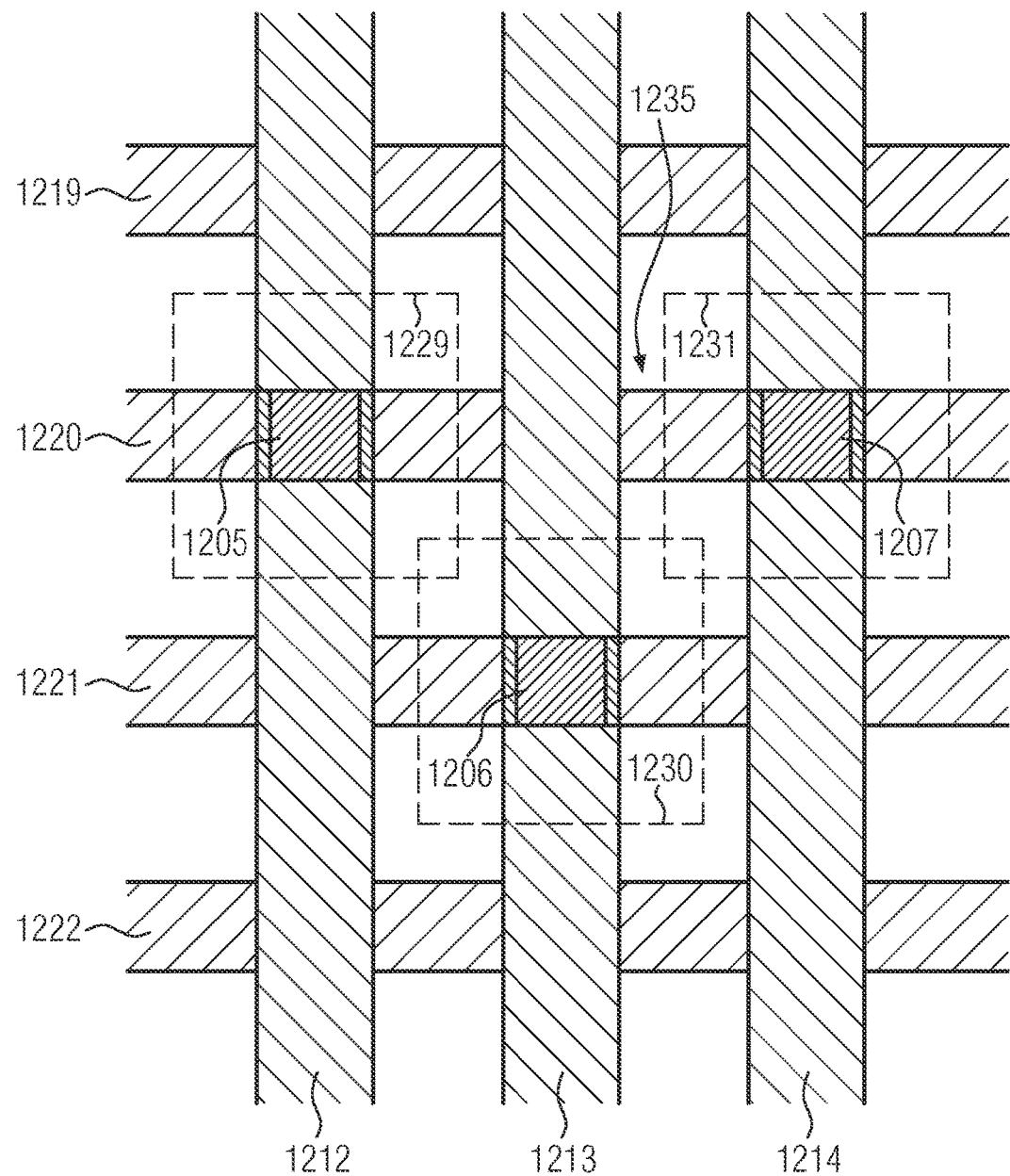

FIGS. 12*a* and 12*b* schematically illustrate further examples of design rules relating to contact vias. The design rules illustrated in FIGS. 12*a* and 12*b* relate to the arrangement of self-aligned contact vias 1201 to 1207. Self-aligned contact vias may be formed using known techniques that allow a self-alignment of edges of the contact vias with edges of metals lines provided above the contact vias. Techniques for the formation of self-aligned contact vias are known.

In FIGS. 12*a* and 12*b*, reference numerals 1208 to 1214 denote metal lines above the contact vias 1201 to 1207, and reference numerals 1215 to 1222 denote metal lines that are below the contact vias 1201 to 1207. Reference numerals 1223, 1224 exemplarily illustrate edges of the contact via 1201 which are self-aligned with edges of the metal line 1211 above the contact via 1201. Similarly, contact vias 1202 to 1207 have self-aligned edges, which are denoted by a hatching corresponding to the hatching of the edges 1223, 1224 of the contact via 1201.

Contact vias 1201 to 1207 having self-aligned edges may be subject to specific design rules, which may be more complicated than the general design rules for contact vias described above with reference to FIG. 11, wherein the constraints defined by the design rules may depend on whether the contact vias belong to a same contact via cluster or not. Dashed lines 1225 to 1231 illustrate conditions relating to the arrangement of contact vias that are fulfilled for contact vias belonging to a same cluster, wherein contact vias wherein the areas around the contact vias enclosed by the respective dashed lines overlap belong to the same cluster. In particular, contact vias 1201, 1202, 1203 form a first contact via cluster, and contact vias 1205, 1206, 1207 form a second contact via cluster. Contact via 1204 does not belong to a cluster, since the area enclosed by dashed line 1228 does not overlap a corresponding area of another contact via.

Design rules relating to clusters of contact vias may include via cluster spacing rules that define a minimum spacing 1232 between contact vias in the same cluster and a greater minimum spacing 1234 between contact vias that are not in the same cluster. The clusters of contact vias may further be subject to via cluster rules that define constraints for the maximum number of contact vias in a cluster (for instance five contact vias), and constraints relating to the shape of contact via clusters. For example, the arrangement of the contact vias 1201, 1202, 1203 may be in conformity with via cluster rules, whereas the arrangement of contact vias 1205, 1206, 1207 may violate a via cluster rule that forbids the occurrence of a notch 1235 in a cluster of contact vias.

Among the above-described design rules for self-aligned contact vias, the via cluster spacing rule that defines the minimum spacing 1232 between contact vias in the same cluster may be relatively easily considered in the automated layout construction process. However, the via cluster rule defining the maximum number of contact vias per cluster, the via cluster spacing rule defining the minimum spacing 1234 between contact vias which are not in the same cluster, and via cluster rules relating to the allowable shapes of contact via clusters may be algorithmically expensive for the layout construction tool 103 performing the automated layout construction process, since a relatively large layout context may need to be considered for determining if contact vias are in the same cluster or not. Hence, in some embodiments, these design rules may be included into the second set of design rules, for example in accordance with the method described above with reference to FIG. 8. Accordingly, the automated layout construction process may be performed on the basis of a simplified rule that requires only that the spacing between self-aligned contact vias is greater than the minimum spacing 1232. Experiments performed by the inventors have shown that violations of via cluster rules and via cluster spacing rules relating to a number of contact vias per cluster, shapes of contact via clusters and a spacing between contact vias which are not in the same cluster are relatively infrequent. Including such design rules into the second set of design rules that are not considered in the automated layout construction process can reduce the complexity of the automated layout construction process, since a consideration of the large layout context of such design rules need not be performed while, due to the relatively infrequent occurrence of violations of such design rules, the amount of modifications of the layout of the integrated circuit that is required for bringing the layout of the integrated circuit into conformity with all design rules can be relatively small. In some embodiments, due to the relatively infrequent occurrence of violations of these rules, they may be included into the second set of design rules in accordance with the method described above with reference to FIG. 10.

Figure 13:
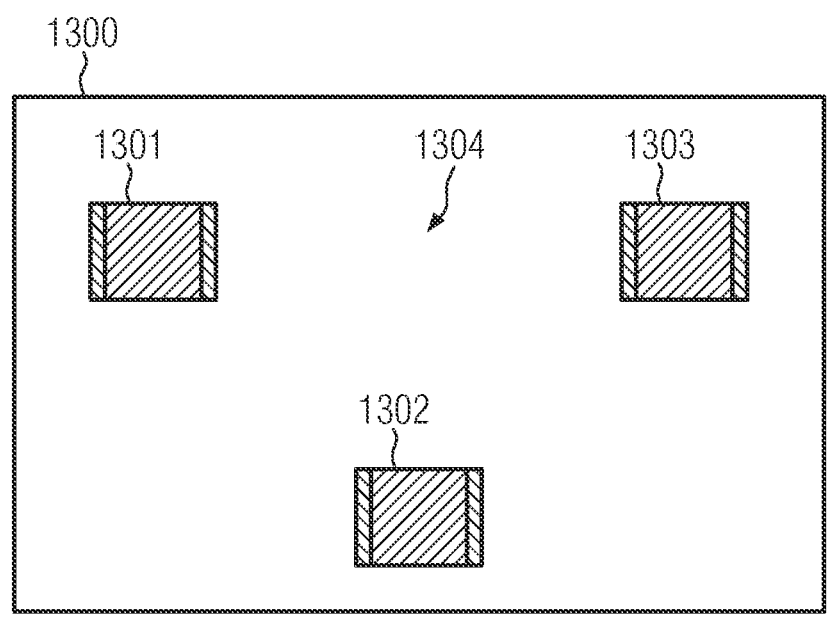
FIG. 13 schematically illustrates a detection pattern that may be used for detection violations of a via cluster rule.

FIG. 13 schematically illustrates a detection pattern 1300 that may be used in embodiments for checking the layout of the integrated circuit for violations of the design rule specifying that clusters of self-aligned contact vias may not include a notch 1235 as described above with reference to FIG. 12b. The detection pattern 1300 may include an arrangement of self-aligned contact vias 1301, 1302, 1303 arranged in the shape of a cluster having notch 1304. In the pattern matching process performed at 302 in the methods described above with reference to FIG. 3, a match between the detection pattern 1300 and a section of the layout of the integrated circuit including a cluster having a notch can be obtained.

Figure 14A:
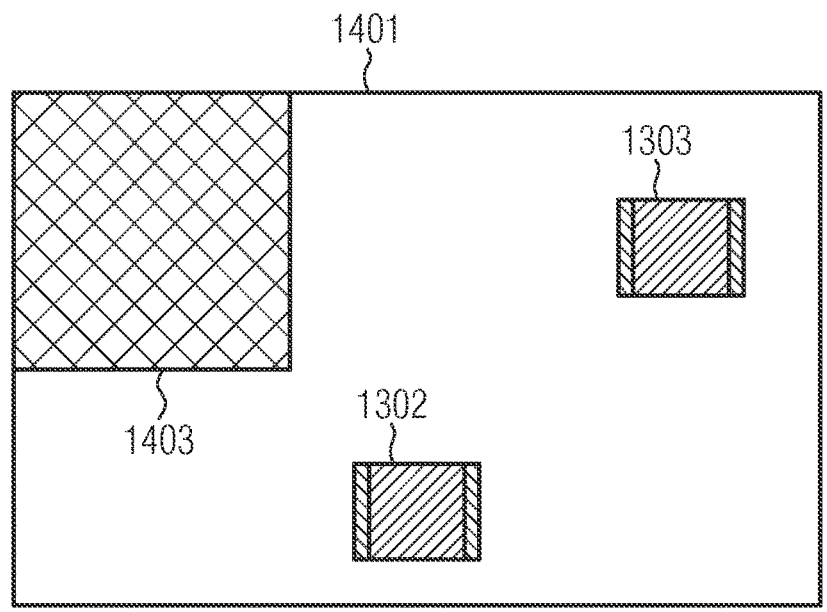
FIGS. 14a and 14b schematically illustrate repair patterns that may be used for bringing a circuit layout into design rule conformity when a violation of a via cluster rule is detected by means of the detection pattern of FIG. 13.
Figure 14B:
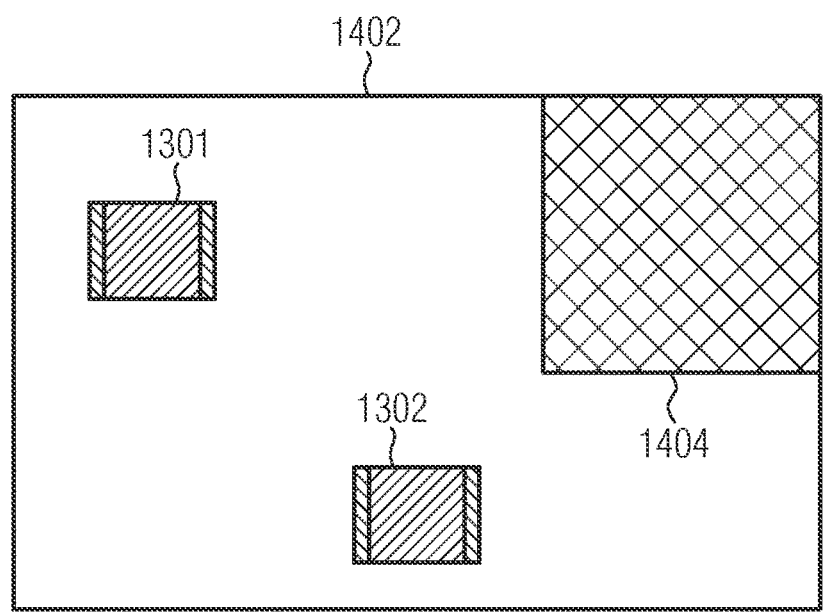

FIGS. 14a, 14b schematically illustrate repair patterns 1401, 1402 that may be determined for sections of the layout of the integrated circuit that match the detection pattern 1300 and may be used for modifying the layout of the integrated circuit. In particular, the repair patterns 1401, 1402 may be employed in methods as described above with reference to FIG. 5, wherein an iteration of an automated layout construction process using the determined repair patterns as guidance is performed.

Repair pattern 1401 includes a blockage 1403 at the location of the contact via 1301. Thus, in the iteration of the automated layout construction process, no contact via will be placed at the location of contact via 1301, so that the notch of the cluster of contact vias is removed.

Repair pattern 1402 includes a blockage 1404 at the location of the contact via 1303, so that, in the iteration of the automated layout construction process, no contact via will be placed at the location of contact via 1303, and a configuration of the cluster of contact vias without a notch is obtained.

In the iteration of the automated layout construction process, the layout construction tool 103 may employ one of the repair patterns 1401, 1402, depending on which is more appropriate in view of the optimization of the layout of the integrated circuit, and can place a contact via providing the functionality of the contact via matching the contact via pattern 1301 or the contact via pattern 1303, respectively, at another location. Thus, the layout of the integrated circuit may be brought into conformity with the design rules specifying that clusters of contact vias may not include notches.

Further detection patterns may be provided for the checking of the layout of the integrated circuit for violations of design rules relating to the maximum number of contact vias per cluster and the minimum spacing 1234 between contact vias that are not in the same cluster, and repair patterns for fixing violations of such design rules may also be provided.

FIG. 15 schematically illustrates fat metal spacing rules that may be provided in some embodiments. In FIG. 15, reference numeral 1501 denotes a first metal line having an edge 1510, and reference numeral 1502 denotes a second metal line having an edge 1511. Fat metal spacing rules can define constraints for a spacing between the edges 1510, 1511 of the metal lines 1501, 1502. The fat metal spacing rules can define a minimum spacing between the edges 1510, 1511, which can depend on widths 1504, 1505 of the metal lines 1501, 1502, lengths 1506, 1507 of the edges 1510, 1511 and a parallel run length 1512 of the edges 1510, 1511. The fat metal spacing rules can define a first minimum spacing 1508, which must be fulfilled if edges 1510, 1511 have a relatively large length and/or a relatively large parallel run length and a smaller second minimum spacing 1509 that applies for relatively short edges 1510, 1511 and/or if edges 1510, 1511 have only a relatively short parallel run length.

Additionally, the minimum spacing between edges 1510, 1511 can depend on whether the edges 1510, 1511 are oriented along a preferred direction or a non-preferred direction, wherein the minimum spacing may be greater for edges extending along the non-preferred direction. The preferred direction and the non-preferred direction may be substantially orthogonal to each other.

Considering the above-described fat metal spacing rules in the automated layout construction process may be difficult, since modeling the dependence of the minimum spaces between the edges 1510, 1511 on the lengths 1506, 1507 of the edges 1510, 1511 and their parallel run length 1512 with design rule constructs of existing layout construction tools is difficult if not impossible. According to conventional approaches, one could adopt a pessimistic implementation of the fat metal spacing rules, wherein the spacing between the edges 1510, 1511 is generally required to be greater than the greater spacing 1508. However, this could lead to unnecessarily large spacings between metal lines having relatively short edges and/or only a relatively short parallel run length.

In some embodiments, the fat metal spacing rules may be optimistically modeled by providing a first rule portion, which defines a minimum spacing between the edges 1510, 1511 corresponding to the smaller spacing 1509, and is included into the first set of design rules, so that it is considered in the automated layout construction process, and a second rule portion. The second rule portion defines the dependence of the minimum spacing between the edges 1510, 1511 on the lengths 1506, 1507 and the parallel run length 1512 of the edges 1510, 1511 and is included into the second set of design rules, and, accordingly, it need not be considered in the automated layout construction process.

For ensuring that the final layout of the integrated circuit conforms with the fat metal spacing rules, detection patterns that match sections of the layout of the integrated circuit that do not satisfy the second rule portion of the fat metal design rules, and one or more repair patterns may be provided. The repair patterns may include a metal blockage that defines the correct spacing between the edges 1510, 1511.

Experiments performed by the inventors have shown that violations of the second rule portion of the fat metal spacing rules are relatively rare, and in many cases, the layout of the integrated circuit created by the automated layout construction process is already in conformity with the fat metal spacing rules, although only the first rule portion is considered in the automated layout construction process. If a violation of the second rule portion of the fat metal spacing rules should occur, it can be fixed by using the detection patterns and the replacement patterns, as described above. In the experiments, an improved convergence of the automated layout construction process and higher values of the created layouts in design for manufacturing metrics have been obtained. Due to the relatively rare occurrence of violations of the second rule portion, in some embodiments, it may be included into the second set of design rules in accordance with the method described above with reference to FIG. 10.

FIG. 16 schematically illustrates a via-to-metal spacing rule defining a constraint for spacings between vias and ends of metal lines. The via-to-metal spacing rule illustrated in FIG. 16 can define a minimum spacing 1603 between a contact via 1602 and an end 1604 of a metal line 1601. In some embodiments, the via-to-metal spacing rule as shown in FIG. 16 may be included into the first set of design rules that is considered in the automated layout construction process.

FIG. 17 schematically illustrates another via-to-metal spacing rule which may, depending on the frequency of occurrence of violations thereof, be included into the first set of design rules or into the second set of design rules that are not considered in the automated layout construction process, for example in accordance with the method described above with reference to FIG. 10. The via-to-metal spacing rule defines a minimum spacing 1703 between a contact via 1704 and an inner vertex 1702 of a metal line 1701. For fixing violations of the design rule, a detection pattern and one or more repair patterns may be provided. The repair patterns may include one or more blockages defining a space between the contact via 1704 and the corner of the metal line. Additionally and/or alternatively, a repair pattern including a metal patching in the corner of the inner vertex 1702 of the metal line 1701 may be provided.

Figure 18:
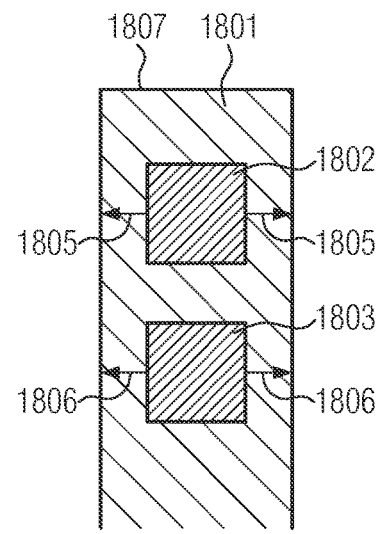
FIG. 18 schematically illustrates complex multicut enclosure rules.

FIG. 18 schematically illustrates a complex multicut enclosure rule, being another example of a design rule that may be included into the second set of design rules that is not considered in the automated layout construction process performed at 203 in the method described above with reference to FIG. 2.

In FIG. 18, reference numeral 1801 denotes a metal line having an end 1807, which may be an upper line end and/or a lower line end. Reference numerals 1802, 1803 denote contact vias providing an electrical connection between the metal line 1801 and another metal line. The contact vias 1802, 1803 are part of the so-called multiple cut, being an arrangement including two or more contact vias (for example, two contact vias as shown in FIG. 18) that connect the same metal lines. The individual contact vias of the multiple cut may provide a certain degree of redundancy, so that an electrical connection between the two metal lines is present even if, for example due to an issue occurring during the manufacturing of the integrated circuit, one of the contact vias does not provide a sufficient electrical connection.

The complex multicut enclosure rule can define enclosures 1805, 1806 for the contact vias 1802, 1803 that depend on their location in relation to the end 1807 of the metal line 1801.

For fixing violations of complex multicut enclosure rules, detection patterns and repair patterns may be provided. Repair patterns for fixing violations of complex multicut enclosure rules may include metal patches to transform line ends into line sides and line end via enclosure extensions, wherein metal is added only at a via enclosure within a line end.

Figure 19:
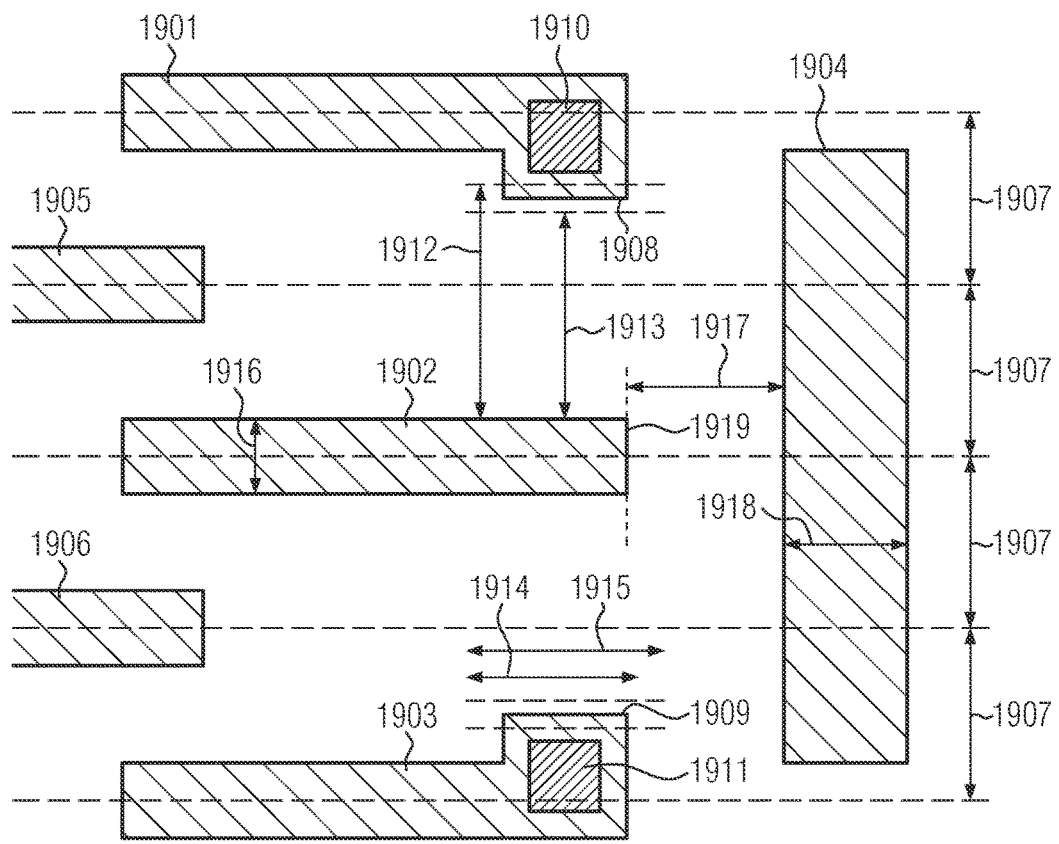
FIG. 19 schematically illustrates dense end of line same mask spacing rules.

FIG. 19 schematically illustrates a dense end of line same mask spacing rule, being yet another example of a design rule that may be included into the second set of design rules that is not considered in the automated layout construction process performed at 203 in the method described above with reference to FIG. 2.

FIG. 19 shows a plurality of metal lines 1901, 1902, 1903, 1904, 1905, 1906. For forming the metal lines 1901 to 1906, double pattern techniques may be employed, wherein two separate photomasks are employed for patterning processes that are used for forming the metal lines 1901 to 1906. For example, metal lines 1901, 1902, 1903, 1904 may be formed using a first photomask, and metal lines 1905, 1906 may be formed using a second photomask. Double patterning techniques may allow a pitch 1907 between adjacent metal lines that is smaller than a minimum pitch obtainable by patterning adjacent metal lines with the same mask.

The dense end of line same mask spacing rule may define a constraint for a spacing 1917 between an end 1919 of the metal line 1902, which extends along a first direction (horizontal in the plane of drawing of FIG. 19) and the metal line 1904 which extends along a second direction (vertical in the plane of drawing of FIG. 19) that is perpendicular to the first direction, wherein the spacing 1917 must be greater than a minimum spacing. The dense end of line same mask spacing rule may need to be applied only if metal lines 1901, 1902, 1903, 1904 are formed using the same photomask, and only if further conditions relating to spacings between edges 1908, 1909 and the metal line 1902 are fulfilled. In particular, the dense end of line same mask spacing rule may need to be applied if the spacings between the edges 1908, 1909 of the metal lines 1901, 1903 and the metal line 1902 is within a range from a lower limit 1913 to an upper limit 1912 and on whether widths 1916, 1918 of the metal lines 1902, 1904 are smaller than a threshold value. Moreover, the dense end of line same mask spacing rule may need to be applied only if an extension of the edges 1908, 1909 is within a range from a lower limit 1914 to an upper limit 1915.

Dense end of line same mask spacing rules as described above may be difficult if not impossible to implement in layout construction tools, since the assignment of metal lines to photomasks used in double patterning processes is typically performed only after the placement of the metal lines, so that, at the point in time at which the metal lines 1901 to 1906 are placed in the layout of the integrated circuit, it is usually not known if the dense end of line same mask spacing rule needs to be applied or not. Accordingly, most conventional layout tools only support this rule with large pessimism. A method as described above with reference to FIG. 7 would detect this by showing bad tool convergence.

In methods according to some embodiments, dense end of line same mask spacing rules as described above may be included into the second set of design rules, so that they do not need to be considered in the automated layout construction process. For fixing violations of dense end of line same mask spacing rules, detection patterns configured for detecting violations of dense end of line same mask spacing rules and repair patterns may be employed. The repair patterns may include metal patches for transforming line ends into line sides. Additionally or alternatively, repair patterns including blockages for increasing a spacing between neighboring metal lines, for example for increasing a spacing between metal line 1902 and metal lines 1901, 1903, may be provided. Further repair patterns may include metal patches that are provided for increasing the width 1918 of the metal line 1904.

In other embodiments, dense end of line same mask spacing rules as described above may be partially included into the first set of design rules that is considered in the automated layout construction process. In such embodiments, a subrange of at least one of the ranges specified in the conditions that define when the dense end of line same mask spacing rule is to be applied may be selected, for example a subrange of the range from the lower limit 1913 to the upper limit 1912 for the spacing between the edges 1908, 1909 and the metal line 1902 and/or a subrange of the range from the lower limit 1914 to the upper limit 1915 for the extension of the edges 1908, 1909.

A modified version of the dense end of line same mask spacing rule may be provided, wherein the conditions that define when the rule is to be applied specify the at least one subrange instead of the corresponding range(s) of the original rule. Accordingly, the modified version of the dense end of line same mask spacing rule applies to a more limited set of layouts than the original rule. Considering the modified version of the dense end of line same mask spacing rule can simplify the automated layout construction process, while still avoiding a substantial amount of design rule violations.

The modified version of the dense end of line same mask spacing rule may be included into the first set of design rules, so that it is considered in the automated layout construction process, and the original dense end of line same mask spacing rule may be included into the second set of design rules, so that layout sections that violate the original rule, but not the modified rule, are detected in the checking of the layout of the integrated circuit for design rule violations wherein at least one member of the second set of design rules is not satisfied, and are corrected as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   obtaining a plurality of design rules for an integrated circuit;
   dividing said plurality of design rules into an unselected first set of design rules and a selected second set of design rules in a computer system, wherein design rules in said second set do not exist in said first set, and dividing said plurality of design rules comprises selecting said second set of design rules by performing at least one of:
      selecting design rules from said plurality of design rules that cannot be modeled exactly with design rule constructs provided by a layout construction tool that is used for performing said automated layout construction process;
      selecting design rules from said plurality of design rules that are algorithmically expensive for said layout construction tool; and
      selecting design rules from said plurality of design rules whose omission accounts for a number of design rule violations that is smaller than a predetermined design rule violation number value;
   performing an automated layout construction process using said computer system, said automated layout construction process creating a layout of said integrated circuit, said automated layout construction process being performed on the basis of said first set of design rules but not on the basis of said second set of design rules;
   checking said layout of said integrated circuit for design rule violations using said computer system, wherein at least one member of said second set of design rules is not satisfied; and
   modifying said layout of said integrated circuit in said computer system for bringing said layout of said integrated circuit into conformity with each of said plurality of design rules if one or more design rule violations are found in said checking of said integrated circuit.

2. The method of claim 1, wherein said checking of said layout of said integrated circuit for design rule violations comprises:
   providing a set of detection patterns corresponding to said second set of design rules; and
   performing a pattern matching process for identifying one or more sections of said layout of said integrated circuit that match at least one member of said set of detection patterns, each match being indicative of at least one of said one or more design rule violations.

3. The method of claim 2, wherein said modifying said layout of said integrated circuit comprises:

providing a set of repair patterns, each member of said set of repair patterns defining a repair solution for said layout of said integrated circuit; and for each section of said layout of said integrated circuit identified by said pattern matching process, determining at least one member of said set of repair patterns.

4. The method of claim 3, wherein said modifying said layout of said integrated circuit further comprises:

for each section of said layout of said integrated circuit identified by said pattern matching process, replacing the section of said layout of said integrated circuit with one of said at least one member of said set of repair patterns determined for the section of said layout.

5. The method of claim 3, wherein said modifying said layout of said integrated circuit further comprises performing an iteration of said automated layout construction process, wherein said at least one member of said set of repair patterns is used as a guidance.

6. The method of claim 5, wherein said at least one member of said set of repair patterns includes at least one blockage.

7. The method of claim 3, further comprising:

performing a classification of each of said one or more sections of said layout of said integrated circuit identified by said pattern matching process;

wherein said determining at least one member of said set of repair patterns for each of said one or more sections of said layout of said integrated circuit identified by said pattern matching process is performed on the basis of said classification.

8. The method of claim 7, wherein said performing said classification comprises classifying each of said one or more sections of said layout of said integrated circuit identified by said pattern matching process into a class, each class having one or more members of said set of repair solutions associated therewith, and wherein said determining at least one member of said set of repair patterns for each of said one or more sections of said layout of said integrated circuit identified by said pattern matching process comprises providing the one or more members of said set of repair solutions associated with the class of the respective section of said layout of said integrated circuit.

9. The method of claim 1, wherein said selecting design rules that are algorithmically expensive for said layout construction tool comprises:

performing a first test run of said automated layout construction process that is based on a first test set of design rules including at least a part of said plurality of design rules;

performing a second test run of said automated layout construction process that is based on a second test set of design rules, said second test set of design rules being a subset of said first test set; and including one or more design rules that are members of said first test set of design rules but not of said second test set of design rules into said second set of design rules if a selection criterion that is based on a comparison of a convergence of said first test run and a convergence of said second test run is fulfilled.

10. The method of claim 1, wherein said selecting design rules that are algorithmically expensive for said layout construction tool comprises:

determining, for each of said plurality of design rules, a normalized size of a layout context of the design rule; and including one or more design rules from said plurality of design rules for which the determined normalized size of said layout context is greater than a predetermined size value into said second set of design rules.

11. The method of claim 1, wherein said selecting design rules that are algorithmically expensive for said layout construction tool comprises:

determining, for each of the design rules of said plurality of design rules, a number of circuit features in a layout context of the design rule; and including one or more design rules from said plurality of design rules for which the determined number of circuit features in said layout context is greater than a predetermined circuit feature number value into said second set of design rules.

12. The method of claim 1, wherein said plurality of design rules comprises at least one of:

one or more via cluster rules, each via cluster rule defining a constraint for at least one of a shape of via clusters and a maximum number of vias per via cluster; and one or more via cluster spacing rules, each via cluster spacing rule defining a constraint for a spacing of vias in a via cluster;

wherein at least one of said one or more via cluster rules and said one or more via cluster spacing rules is selected and included into said second set of design rules.

13. The method of claim 1, wherein said plurality of design rules comprises:

one or more fat metal spacing rules, each fat metal spacing rule including a first rule portion defining a constraint for a spacing of metal lines that depends on at least one of an orientation of edges of said metal lines and widths of said metal lines and a second rule portion defining a further constraint that depends on at least one of a length of said edges of said metal lines and a parallel run length of said edges of said metal lines;

wherein said second rule portions of said one or more fat metal spacing rules are selected and included into said second set of design rules, said first rule portions of said fat metal spacing rules being included into said first set of design rules.

14. The method of claim 1, wherein said plurality of design rules comprises:

one or more via to metal spacing rules, each via to metal spacing rule defining a constraint for a spacing between vias and metal lines;

wherein at least one of said one or more via to metal spacing rules is selected and included into said second set of design rules.

15. The method of claim 14, wherein said one or more via to metal spacing rules comprise at least one of a first via to metal spacing rule defining a constraint for a spacing between vias and ends of metal lines and a second via to metal spacing rule defining a constraint for a spacing between vias and inner vertices of metal lines, said first via to metal spacing rule being included into said first set of design rules, said second via to metal spacing rule being selected and included into said second set of design rules.

16. The method of claim 1, wherein said plurality of design rules comprises:

one or more complex multicut enclosure rules, each complex multicut enclosure rule defining a constraint for a metal enclosure of multiple vias depending on their location in relation to upper and lower line ends;

wherein said one or more complex multicut enclosure rules are selected and included into said second set of design rules.

17. The method of claim 1, wherein said plurality of design rules comprises:
- one or more dense end of line same mask spacing rules, each dense end of line same mask spacing rule defining a constraint for a spacing between an end of a first metal line extending along a first direction and a second metal line extending along a second direction that is perpendicular to said first direction, wherein said constraint depends on a width of said second metal line, a spacing between said end of said first metal line and a third metal line along said second direction, and on whether said first, second and third metal lines are formed by means of a same mask in a double patterning process;
- wherein said one or more dense end of line same mask spacing rules are selected and included into said second set of design rules.

18. The method of claim 1, further comprising manufacturing said integrated circuit in accordance with said modified layout.

19. The method of claim 1, wherein said plurality of design rules comprises a design rule having a condition defining when the design rule is to be applied, said condition specifying a range for a spacing between circuit features, and wherein said selecting a part of said plurality of design rules comprises:
- selecting a subrange of said range;
- including a modification of said design rule, wherein said condition specifies said subrange instead of said range into said first set of design rules; and
- including said design rule into said second set of design rules.

* * * * *